United States Patent
Nakamura et al.

(10) Patent No.: US 7,795,730 B2
(45) Date of Patent: Sep. 14, 2010

(54) WIRING SUBSTRATE AND METHOD OF MANUFACTURING THEREOF, AND THIN FILM TRANSISTOR AND METHOD OF MANUFACTURING THEREOF

(75) Inventors: Osamu Nakamura, Atsugi (JP); Junko Sato, Atsugi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 40 days.

(21) Appl. No.: 11/934,528

(22) Filed: Nov. 2, 2007

(65) Prior Publication Data

US 2008/0067592 A1    Mar. 20, 2008

Related U.S. Application Data

(62) Division of application No. 10/952,754, filed on Sep. 30, 2004, now Pat. No. 7,371,598.

(30) Foreign Application Priority Data

Oct. 2, 2003   (JP) .............................. 2003-344257

(51) Int. Cl.
    *H01L 23/48* (2006.01)
(52) U.S. Cl. .................. 257/741; 257/774; 257/751; 257/753; 257/761; 257/763; 257/764
(58) Field of Classification Search ................. 257/741, 257/774, 751, 753, 761, 763, 764

See application file for complete search history.

(56) References Cited

U.S. PATENT DOCUMENTS

| 6,538,323 B1 | 3/2003 | Sakata et al. |
| 6,660,545 B2 | 12/2003 | Furusawa |
| 6,674,171 B2 * | 1/2004 | Yamaguchi ............... 257/774 |
| 6,737,363 B2 | 5/2004 | Miyajima et al. |
| 6,933,216 B2 | 8/2005 | Sakata et al. |
| 2004/0147113 A1 | 7/2004 | Yamazaki et al. |
| 2004/0263564 A1 | 12/2004 | Maekawa et al. |

(Continued)

FOREIGN PATENT DOCUMENTS

CN    1348207    5/2002

(Continued)

OTHER PUBLICATIONS

Office Action (Application No. 200410083448.0 CN7391 Dated: Aug. 24, 2007) with FULL translation.

(Continued)

*Primary Examiner*—Long Pham
(74) *Attorney, Agent, or Firm*—Nixon Peabody LLP; Jeffrey L. Costellia

(57) ABSTRACT

The invention includes a first step for forming a first conductive layer composed of a high melting point metal to be in contact with an insulating layer; and a second step for forming a second conductive layer by discharging a composition containing a conductive material so as to be in contact with the first conductive layer. The first conductive layer is formed prior to forming the second conductive layer by droplet discharging, and hence, adhesiveness and peel resistance of the second conductive layer are improved. Furthermore, the insulating layer is covered with the first conductive layer, thereby preventing damage or destruction of the insulating layer.

24 Claims, 16 Drawing Sheets

U.S. PATENT DOCUMENTS

| | | |
|---|---|---|
| 2005/0045891 A1 | 3/2005 | Yamazaki et al. |
| 2005/0064633 A1 | 3/2005 | Mikoshiba |
| 2005/0095356 A1 | 5/2005 | Nakamura et al. |
| 2005/0124164 A1 | 6/2005 | Sakata et al. |
| 2006/0158482 A1 | 7/2006 | Nakamura et al. |

FOREIGN PATENT DOCUMENTS

| | | |
|---|---|---|
| CN | 1434508 | 8/2003 |
| JP | 06-236880 | 8/1994 |
| JP | 07-105740 | 4/1995 |
| JP | 08-186171 | 7/1996 |
| JP | 2000-164531 | 6/2000 |
| JP | 2001-133613 A | 5/2001 |
| JP | 2002-359347 | 12/2002 |
| WO | WO03019631 * | 3/2003 |

OTHER PUBLICATIONS

T.Shimoda "Ink-Jet Technology for Fabrication Processes of Flat Panel Displays", SID Digest '03; SID International Symposium Digest of Technical Papers, Jan. 2003, pp. 1178-1181.

* cited by examiner 9502
9501

9602
9601

9802
9801

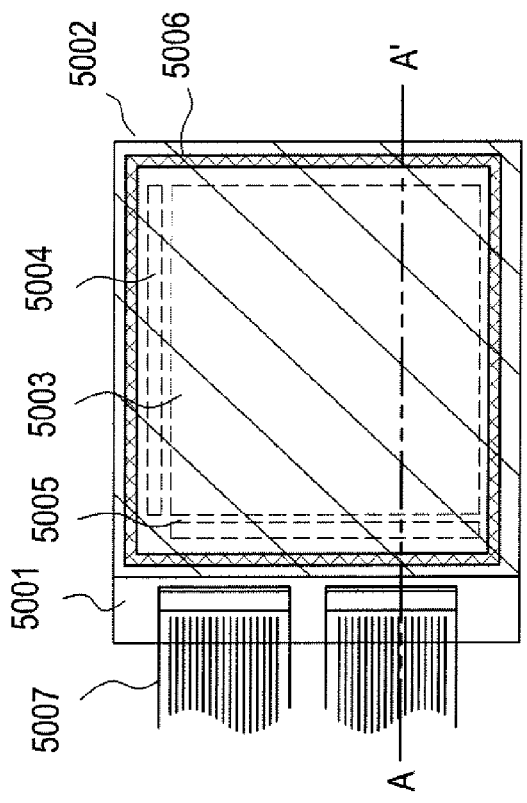
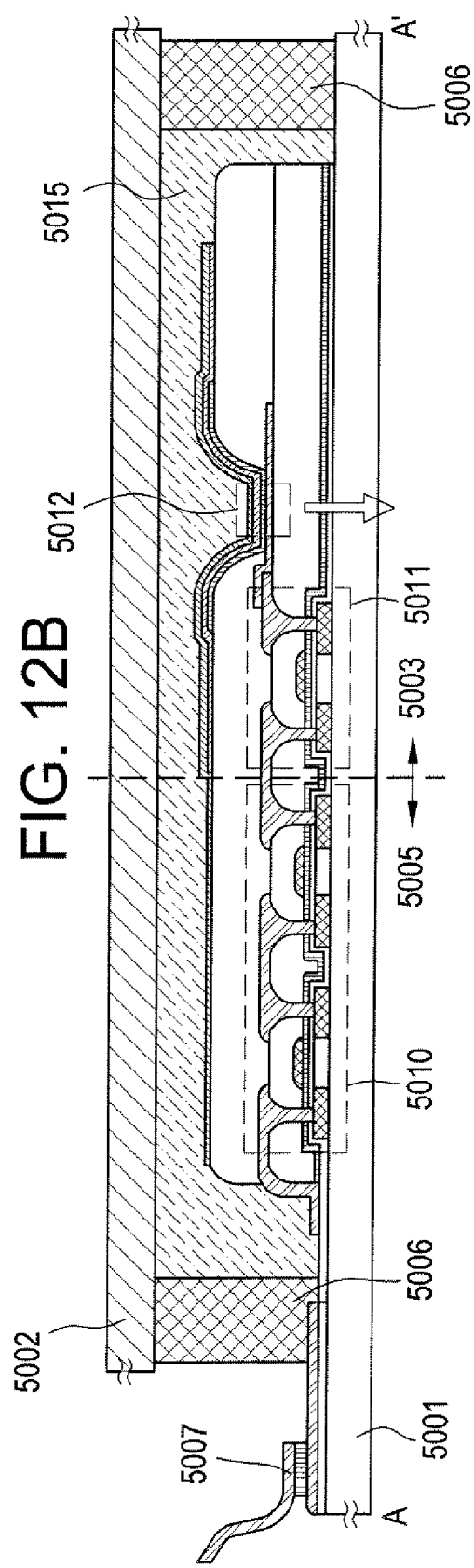
FIG. 12A
FIG. 12B

WIRING SUBSTRATE AND METHOD OF MANUFACTURING THEREOF, AND THIN FILM TRANSISTOR AND METHOD OF MANUFACTURING THEREOF

BACKGROUND OF THE INVENTION

1. Field of the Invention

The present invention relates to a wiring substrate formed by droplet discharging and a method of manufacturing thereof. The invention further relates to a thin film transistor and a method of manufacturing thereof.

2. Description of the Related Art

Recently, a droplet discharging technique has been applied to the field of a flat panel display, and developed actively. Since a liquid droplet is directly jetted over a substrate, the droplet discharging technique has various advantages in that a mask is not required, the technique is easily applied to a large-size substrate, the material efficiency is high, and the like. Accordingly, the droplet discharging technique has been applied to formation of a color filter and an electrode for a plasma display, and the like.

When a wiring substrate is formed by droplet discharging, a composition including particles in nanometer size is used. Since a thin film formed of the above-mentioned composition is not well-adhered to an underlying thin film, however, the thin film formed of the composition is likely to be separated from the underlying thin film. Therefore, when the wiring substrate including a pattern formed of the composition is subjected to a wet step such as a washing step, which is indispensable for the semiconductor processing, the pattern is likely to be separated from the underlying thin film.

Further, when the composition is jetted through an end of a nozzle, a phenomenon, which is called as the Lenard phenomenon, is caused. The Lenard phenomenon is the one in which a jetted composition is charged positively due to the deviation of electric charge. Therefore, it has been considered that the thin film adhered with the composition is damaged or destroyed due to the positively-charged composition.

SUMMARY OF THE INVENTION

In view of the foregoing, it is an object of the present invention to provide a wiring substrate having improved adhesiveness and peel resistance, and a method of manufacturing the same. Further, it is an object of the invention to provide a wiring substrate, which can prevent damage or destruction of a thin film adhered with a composition, and a method of manufacturing the same. Furthermore, it is an object of the invention to provide a thin film transistor having improved adhesiveness and peel resistance by using the above-mentioned wiring substrate and the method of manufacturing thereof, and a method of manufacturing the thin film transistor.

In order to overcome the problems set forth above in the related art, the invention provides following countermeasures.

According to one aspect of the invention, a method of manufacturing a wiring substrate includes: a first step for forming a first conductive layer composed of a high melting point metal, which is in contact with an insulating layer; and a second step for discharging a composition containing a conductive material so as to form a second conductive layer which is in contact with the first conductive layer. The first conductive layer is formed prior to forming the second conductive layer by droplet discharging, and hence, the adhesiveness and peel resistance of the second conductive layer are improved. Further, the insulating layer is covered with the first conductive layer, preventing the insulating layer from being damaged and destroyed.

According to another aspect of the invention, a method of manufacturing a wiring substrate includes: a first step for forming a first conductive layer composed of a high melting point metal which is in contact with an insulting layer having an opening; and a second step for discharging a composition including a conductive material so as to form a second conductive layer which fills the opening. Accordingly, the adhesiveness and peel resistance of the second conductive layer are improved. In addition, the damage or destruction of the insulating layer can be prevented. Furthermore, the first conductive layer functions as a barrier layer to prevent the ingress of impurities from the insulating layer.

According to another aspect of the invention, a first conductive layer made from a high melting point metal is interposed between an insulating layer and a second conductive layer. The high melting point metal is formed of such material as Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium). The first conductive layer is formed by a known method such as sputtering; vapor deposition; ion implantation; CVD; dipping; and spin coating. Preferably, the first conductive layer is formed by sputtering, dipping, or spin coating. When the first conducive layer will be insulated later, it is more preferable that the first conductive layer be formed to have a thickness of from 0.01 to 10 nm, and be insulated by natural oxidation.

According to another aspect of the invention, an insulating layer is formed of an oxide material containing silicon or a nitride material containing silicon. This is because a thin film composed of such materials has a preferable dielectric constant etc. in order to serve as a gate insulating film.

According to another aspect of the invention, an insulating layer with an opening is formed of an organic material or a material having a skeleton structure, which is composed by bonding silicon and oxygen. Since the organic material has superior flatness, when an electric conductor is formed thereon later, the film thickness of the electric conductor is not extremely thin in a step difference or the electric conductor is not disconnected in a step difference. Therefore, it is preferable that the insulating layer be formed of the organic material. The organic material further has a low dielectric constant. Accordingly, when an interlayer insulator for a plurality of wirings is formed of the organic material, wiring capacitance is reduced. Consequently, a multilayer wiring can be formed, which results in high performance and sophisticated function.

As the material having the skeleton structure which is formed by bonding silicon and oxygen, siloxane polymer can be cited typically. More specifically, the siloxane polymer has a skeleton structure formed by bonding silicon and oxygen, and corresponds to a material at least including hydrogen in the substituent or a material at least including any one of fluorine, alkyl group, aromatic hydrocarbon in the substituent. The siloxane polymer is also superior in the flatness, and further includes a light transmitting property and a heat resistance property. Therefore, an insulator formed of siloxane polymer can be subjected to a heat treatment at a temperature of from 300 to 600° C. or less. By performing the heat treatment, a hydrogenation treatment and a baking treatment can be carried out, simultaneously.

The insulating layer including an opening is formed with a thickness of from 100 nm to 2 μm since the opening for connecting a pattern of an upper layer and a pattern of a lower layer is formed in the insulating layer.

The second conductive layer is formed of a composition including silver, gold, copper, or indium tin oxide. Molecules of these materials can be processed in nanometers size. When nano-size particles are dispersed in a solvent, it is possible to form the second conductive layer easily by droplet discharging.

The invention further includes a step for insulating a part of the first conductive layer where is not in contact with the second conductive layer after the above-mentioned second step. The invention also includes a step for etching a part of the first conductive layer where is not in contact with the second conductive layer. These steps are carried out to prevent a short-circuit of a plurality of elements or wirings, if necessary. When the step for insulating the first conductive layer is performed, it is preferable that the first conductive layer be formed with a thickness of from 0.01 to 10 nm, and be insulated by natural oxidation as set forth above.

According to another aspect of the invention, a thin film transistor, which has the second conductive layer completed through the above-mentioned step as a gate electrode and the insulating layer as a gate insulating film, is formed.

According to another aspect of the invention, a wiring substrate includes: a first conductive layer formed of a high melting point metal, which is in contact with an insulating layer composed of an oxide material containing silicon, a nitride material containing silicon, an organic material, or a material including a skeleton structure with a bond of silicon and oxygen; and a second conductive layer composed of silver, gold, copper, or indium tin oxide, which is in contact with the first conductive layer. Preferably, the first conductive layer is formed to have a thickness of from 0.01 to 10 nm. The high melting point metal is one of Ti, W, Cr, Al, Ta, Ni, Zr, Hf, V, Ir, Nb, Pd, Pt, Mo, Co, or Rh. Further, the present invention provides a thin film transistor using the insulating layer as a gate insulating film, and the second conductive layer as a gate electrode. The wring substrate and the thin film transistor having the above-described structures are superior in adhesiveness and peel resistance. Therefore, patterns formed over the wring substrate and the thin film transistor are not peeled off even if the wiring substrate and the thin film transistor are subjected to a wet treatment.

By using the droplet discharging technique, the adhesiveness and peel resistance of a conductive layer can be improved. Furthermore, the damage and destruction of an underlying thin film can be prevented according to the invention.

BRIEF DESCRIPTION OF THE DRAWINGS

In the accompanying drawings:

FIG. 12A is a top view of a panel which is one embodiment of a semiconductor device according to the present invention, and FIG. 12B is a cross sectional view thereof (Embodiment 3);

DETAILED DESCRIPTION OF THE INVENTION

Embodiment 1

Figure 1A:
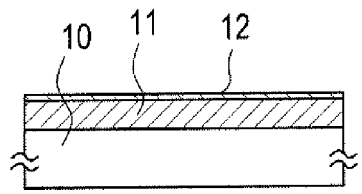
FIGS. 1A to 1D are diagrams explaining a method of manufacturing a wiring substrate according to the present invention (Embodiment Mode 1)
Figure 1B:
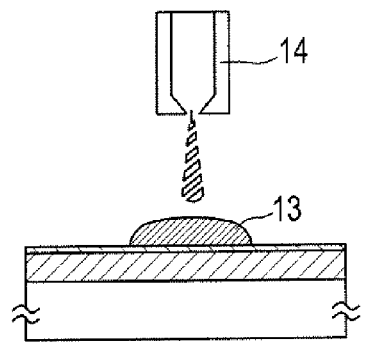

An embodiment mode of the invention will be described with reference to FIGS. 1A to 1D. A substrate 10 is formed of a glass substrate such as a barium borosilicate glass and alumino borosilicate glass; a quartz substrate; a silicon substrate; a metal substrate; a stainless substrate; or a heat-resistant plastic substrate, which can withstand processing temperatures of manufacturing steps for the present invention (see FIG. 1A).

An insulating layer 11 is formed on the substrate 10. The insulating layer 11 is formed of an oxide material containing silicon or a nitride material containing silicon by using a known method such as CVD, plasma CVD, sputtering, and spin coating so as to have a single layer or a lamination layer.

Subsequently, a first conductive layer 12 is formed on the insulating layer 11 by using a known method such as sputtering, and vapor deposition. The first conductive layer 12 is formed of a high melting point metal such as Ti, W, Cr, Al, Ta, Ni, Zr, Hf, V, Ir, Nb, Pd, Pt, Mo, Co, and Rh.

When a step for naturally oxidizing the first conductive layer 12 will be carried out later, the first conductive layer 12 is formed to have a film thickness of from 0.01 to 10 nm. The first conductive film having 0.01 nm in thickness is extremely thin, and therefore, there is a possibility that it does not have a film form. However, the first conductive layer 12 mentioned here includes a state having no film form. Further, in order to make the first conductive layer 12 thinner, it is preferably formed by sputtering.

A second conductive layer 13 is then formed by jetting a composition including a conductive material. The second conductive layer 13 is formed by using a droplet discharging means 14. A unit, which has a means for discharging a liquid droplet such as a nozzle having a discharge port for the composition and a head including one or a plurality of nozzles, is generically referred to as the droplet discharging means. A diameter of a nozzle for the droplet discharging means 14 is set to from 0.02 to 100 μm (preferably, 30 μm or less). A discharge amount of the composition jetted through the nozzle is set to from 0.001 to 100 pl (preferably, 10 pl or less). The discharge amount is increased in proportion to the diameter of the nozzle. A substrate to be processed is preferably set as close to the nozzle as possible so as to jet the composition in a predetermined portion. Preferably, the distance between the substrate and the nozzle is set to about from 0.1 to 3.0 mm (preferably, 1 mm or less).

When the composition is jetted from the droplet discharging means 14, the composition tends to be charged positively since deviation of electric charge is generated. There is a possibility that the insulating layer 11 is damaged due to the positively-charged composition. Since the insulating layer 11 is covered with the first conductive layer 12 in the invention, however, the damage or destruction of the insulating layer 11 can be prevented.

As for the composition jetted through the discharge port, a material in which a conductive material is dissolved or dispersed in a solvent is used. The conductive material corresponds to metal such as Ag, Au, Cu, Ni, Pt, Pd, Ir, Rh, W, and Al; metal sulphide such as Cd, and Zn; oxide such as Fe, Ti, Si, Ge, Si, Zr, and Ba; and a microparticle or a dispersive nanometer-size particle of silver halide. The conductive material further corresponds to indium tin oxide (ITO) used as a transparent conductive film, ITSO composed of indium tin oxide and silicon oxide, organic indium, organic tin, organic zinc, titanium nitride, and the like.

Note that, in consideration of the resistivity value, it is preferable to use a material in which any one of gold, silver, and copper is dissolved or dispersed in a solvent as the composition jetted through the discharge port. More preferably, silver or copper with low resistance is used. When silver or copper is used as the composition, a barrier film is additionally provided therewith in order to prevent impurities. As for the solvent, esters such as butylacetate and ethyl acetate; alcohols such as isopropyl alcohol and ethanol; organic solvents such as methyl ethyl ketone and acetone; and the like can be used. The viscosity of the composition is preferably set to 50 cp or less in order to jet the composition fluently through the discharge port and prevent dryness of the composition. The surface tension of the composition is preferably set to 40 mN/m or less. The viscosity and the like of the composition may be adjusted properly according to a solvent to be used and an intended purpose. For example, the viscosity of a composition in which ITO, organic indium, and organic tin are dissolved or dispersed in a solvent is preferably set to from 5 to 50 mPa·S; the viscosity of a composition in which silver is dissolved or dispersed in a solvent may be set to from 5 to 20 mPa·S; and the viscosity of a composition in which gold is dissolved or dispersed in a solvent may be set to from 10 to 20 mPa·S.

Although the diameter of a particle for an electric conductor depends on the diameter of each nozzle and a predetermined pattern shape, the size of the particle for the electric conductor is preferably as small as possible for the purpose of preventing a clogged nozzle and manufacturing a high-precise pattern. Preferably, the diameter of the particle is set to 0.1 μm or less. The composition is formed by a known method such as electrolyzing, atomizing, and wet reducing, and the particle size thereof is typically about 0.01 to 10 μm. However, in the case of using a gas evaporation method, each nanometer-size molecular protected with a dispersing agent is minute and is about 7 nm in size. Further, when each surface of the nanometer-size particles is covered with a coating material, the nanometer particles among the solvent are not aggregated but are uniformly dispersed in the solvent at a room temperature, and show a property similar to that of aqueous fluid. As a result, the coating material is preferably used.

When the step for discharging a composition is performed under reduced pressure, the solvent of the composition is vaporized during a period from discharging the composition till attaching it to an object to be processed. Consequently, steps for drying and baking, which should be performed later, can be both eliminated. It is preferable that the step for discharging the composition be performed under reduced pressure so as not to form an oxide film and the like on a surface of the electric conductor. After discharging the composition, one or both of a drying step and a baking step is/are performed. Each step for drying and baking is a step of a heat treatment. For example, the drying is performed for 3 minutes at a temperature of 100° C. whereas the baking is performed for 15 to 30 minutes at temperatures from 200 to 350° C., and the purposes, temperatures, and time thereof are varied. The steps for drying and baking are performed at a normal pressure or under reduced pressure by laser beam irradiation, rapid thermal annealing, a heating furnace, and the like. Note that the timing of performing the heat treatment is not limited particularly. The substrate may be heated in advance so as to carry out the steps for drying and baking favorably. At this time, the heating temperature depends on a material of the substrate and the like, but it is generally set to from 100 to 800° C. (preferably, 200 to 350° C.). According to the steps, the nanometer-size particles are in contact with one another and fusing together and fusing bond are accelerated by hardening and shrinking resin in the periphery as well as volatilizing the solvent in the composition or removing the dispersing agent chemically.

A continuous wave or pulsed gas laser or solid state laser may be used for laser beam irradiation. An excimer laser, a YAG laser, and the like are cited for the former gas laser, while lasers using crystals such as YAG and YVO$_4$ doped with Cr, Nd and the like are cited for the latter solid state laser. Preferably, the continuous wave laser is used in relation to the absorptance of laser beam. Alternatively, a so-called hybrid laser irradiation method combining a pulsed oscillation and a continuous wave may be employed. Note that, the laser beam irradiation for the heat treatment may be instantaneously performed for several microseconds to several tens seconds so as not to destroy the substrate 10 according to heat resistance of the substrate 10.

Rapid thermal annealing (RTA) is performed by instantaneously heating the substrate for several microseconds to several minutes while rapidly raising the temperature with an infrared lamp, a halogen lamp, and the like that emits ultraviolet light through infrared light in an inert gas atmosphere. This treatment is performed instantaneously, and hence, only a thin film on the top surface is substantially heated not to adversely influence underlying films. That is, a substrate that is weak in heat resistance such as a plastic substrate is not influenced by the heat treatment.

According to the above-described steps, the insulating layer 11, the first conductive layer 12, and the second conductive layer 13 are completed. When elements and wirings may be shorted to each other since the insulating layer 11 remains coated with the first conductive layer 12, any one of two steps as follows should be carried out.

Figure 1C:
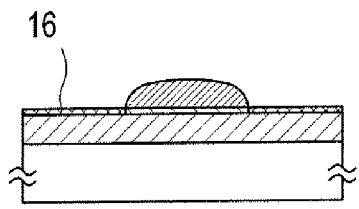

One step is one for forming an insulating layer 16 by insulating a part of the first conductive layer 12 where is not overlapped with the second conductive layer 13 (see FIG. 1C). Specifically, the part of the first conductive layer 12 where is not overlapped with the second conductive layer 13 is oxidized and then insulated. In the case of insulating the first conductive layer 12 partly, the first conductive layer 12 is preferably formed with a thickness of 0.01 to 10 nm such that the part of the first conductive layer is naturally oxidized to become an insulating layer. As a method of naturally oxidizing the first conductive layer, a method of exposing to an oxygen atmosphere, and a method of performing a thermal treatment may be used.

Figure 1D:
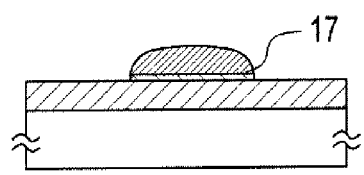

Another step is one for forming a conductive layer 17 by etching the first conductive layer 12 while using the second conductive layer 13 as a mask (see FIG. 1D).

The second conductive layer formed above may be used as a wiring. Or, the second conductive layer 13 may be used as a gate electrode and the insulating layer 11 may be used as a gas insulting film such that they serve as constituent elements for a thin film transistor. Further, a protection film may be additionally formed so as to cover the conductive layer completed through the above-described steps. The protection film may be formed of a known material such as an oxide material containing silicon, and a nitride material containing silicon. Preferably, the protection film is formed of a silicon nitride film having a dense film.

According to the invention as set forth above, since the is first conductive layer 12 is interposed between the insulating layer 11 and the second conductive layer 13, which is formed by droplet discharging, the adhesiveness and peel resistance thereof can be improved, thereby preventing the damage and destruction of underlying thin films.

Embodiment Mode 2

Figure 2A:
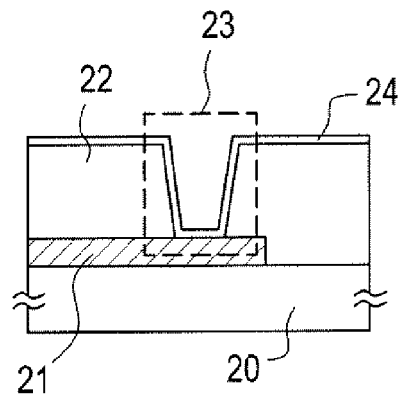
FIGS. 2A to 2D are diagrams explaining a method of manufacturing a wiring substrate according to the invention (Embodiment Mode 2)
Figure 2B:
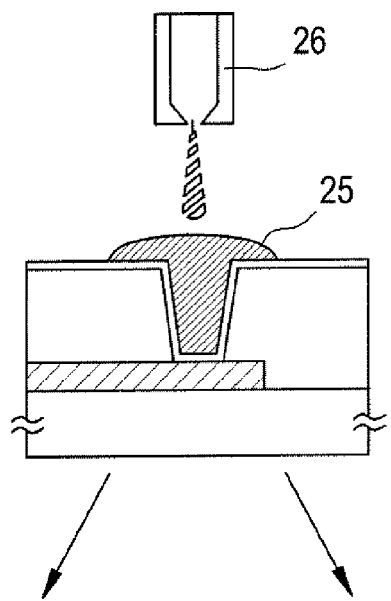

Another embodiment mode of the invention will be describe with reference to FIGS. 2A to 2D. A substrate 20 is formed of a glass substrate, a quartz substrate, and the like (FIG. 2A). An electric conductor (conductor) or a semiconductor 21 is next formed on the substrate 20. The semiconductor 21 is formed on the substrate 20 here by way of example. A base film may be formed on the substrate 20 so as to prevent intrusion of impurities from the substrate 20, if necessary.

An insulating layer 22 is then formed on the substrate 20. The insulating layer 22 is formed to a thickness of from 50 nm to 5 μm (preferably, from 100 nm to 2 μm) by using a known method such as plasma CVD, sputtering, SOG (spin on glass) method, spin coating, and droplet discharging. As a material for the insulating layer 22, following materials can be employed: a material containing silicon such as a silicon oxide film, a silicon nitride film, a silicon nitride oxide film, and a silicon oxynitride film; an organic material such as acrylic, benzocyclobutene, parylene, flare, and light-transmitting polyimide; a compound material formed by polymerization of siloxane polymer etc.; a composition including water-soluble homopolymer and water-soluble copolymer; and the like.

Since the organic material is superior in the flatness, when an electric conductor is formed later, the film thickness of the electric conductor is not extremely thin or the electric conductor is not disconnected. Therefore, the organic material is favorable. Also, the organic material is low in the dielectric constant. Accordingly, when the organic material is used as an interlayer insulator for a plurality of wirings, wiring capacitance can be reduced, thereby forming a multilayer wiring. As a result, high performance and sophisticated function can be realized. Note that, in order to prevent degasification, the organic material is preferably sandwiched between thin films composed of an inorganic material including silicon. Concretely, it is preferable that a silicon nitride oxide film, a silicon nitride film, and the like be formed on and under the organic material by plasma CVD or sputtering.

Siloxane polymer is mentioned as a representative example of a material having a skeleton structure formed by bonding silicon and oxygen and including at least hydrogen in the substituent, or at least one of fluorine, alkyl group, and aromatic hydrocarbon in the substituent. Various materials within the range of the above-mentioned conditions can be used as substitute for the siloxane polymer. The siloxane polymer is superior in flatness and heat resistance, and has a light transmitting property. After forming an insulator by using siloxane polymer, a heating treatment can be carried out at a temperature of from 300 to 600° C. or less. By performing the heat treatment, for instance, a hydrogenation treatment and a baking treatment can be simultaneously carried out.

Subsequently, the insulating layer 22 is patterned and processed by photolithography to form an opening (contact hole) 23. The insulating layer may be processed by either dry etching or wet etching. In the case of using dry etching, an opening 23 having a high aspect ratio (3 or more) can be formed. Therefore, the dry etching technique is preferable for forming a multilayer wiring. A mask, which is used in forming the opening 23, may be formed of an organic material such as polyimide, and acrylic by droplet discharging.

The opening 23 may be formed by droplet discharging rather than photolithography. In the case of using the droplet discharging technique, the opening is formed by jetting a wet etching solution through a nozzle. It is preferable that a step for properly washing the nozzle with a solvent such as water be added so as to control the aspect ratio of the opening 23. Of course, when liquid droplet jetted through the nozzle is changed to water or a head filled with a solvent is replaced, the substrate can be successively processed in a same apparatus. The successive processing is preferable from the viewpoint of reduction in processing time. By performing any one of the above-mentioned methods, the semiconductor 21 formed under the insulating layer 22 is exposed therefrom after forming the opening 23.

A first conductive layer 24 is formed on the insulating layer 22. The first conductive layer 24 is formed by a known method such as sputtering, vapor deposition, and spin coating. The first conductive layer 24 is formed of a material selected from Ti, W, Cr, Al, Ta, Ni, Zr, Hf, V, Ir, Nb, Pd, Pt, Mo, Co, and Ph.

When a step for naturally oxidizing the first conductive layer 24 is carried out later, the first conductive layer 24 is formed to have a thickness of 0.01 to 10 nm. In the case of forming the first conductive film with a thickness of 0.01 nm, since the film thickness thereof is extremely thin, the first conductive layer might not have a thin film form. However, the first conductive layer 24 includes such the state having no thin film form. In order to make the first conductive layer 24 thinner, it is preferably formed by sputtering.

The first conductive layer 24 is capable of improving the adhesiveness between the insulating layer 22 and a second conductive layer 25, which will be formed later as well as functioning as a barrier layer. The first conductive layer 24 is easily embedded, and further makes contact resistance reduced and stabilized. In particular, when the second conductive layer 25 will be formed of silver or copper later, the formation of the first conductive layer 24 is effective in order to prevent impurities.

Subsequently, the second conductive layer 25 is formed by jetting a composition including a conductive material. A droplet discharging means 26 is used for forming the second conductive layer 25. When the composition is jetted from the droplet discharging means 26, the composition tends to be charged positively due to the generation of unbalance of charges. The positive electric charge might destroy the insulating layer 22. Since the insulating layer 22 is coated with the first conductive layer 24, however, it is possible to prevent the insulating layer 22 from being damaged or destroyed.

According to the above-mentioned steps, the insulating layer 22, the first conductive layer 24, and the second conductive layer 25 are completed. Note that, in the case where elements or wirings might be shorted to each other since the insulating layer 22 remains covered with the first conductive layer 24, any one of the following two steps is preferably carried out.

Figure 2C:
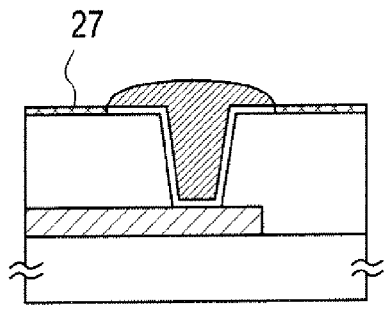

One step is one for forming an insulating layer 27 by insulating a part of the first conductive layer 24, which is not overlapped with the second conductive layer 25 (see FIG. 2C). Specifically, the part of the first conductive layer 24 where is not covered with the second conductive layer 25 is oxidized and then insulated. When the first conductive layer 24 is insulated in such a manner, it is preferable that the first conductive layer 24 be formed to have a thickness of 0.01 to 10 nm. Accordingly, the first conducive layer is oxidized naturally to become the insulating layer 27. As the method for naturally oxidizing the first conductive layer, either a method of exposing the conductive layer to an oxygen atmosphere or a method of performing a heat treatment may be used.

Figure 2D:
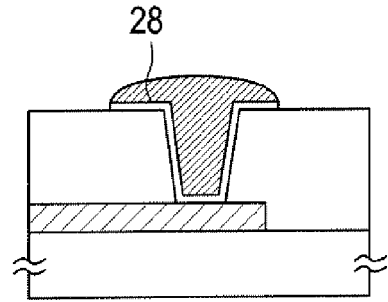

Another method is one for forming a conductive layer 28 by etching the part of the first conductive layer 24 while using the second conductive layer 25 as a mask (see FIG. 2D).

The second conductive layer formed above may be used as a wiring for connecting an upper layer and a lower layer. Although not illustrated in the drawings, a multilayer wiring can be formed by laminating the conductive layers formed according to the present invention. The multilayer wiring is preferably used for a functional circuit, which is necessary to be incorporated with a large number of semiconductor elements, such as a CPU. The multilayer wiring allows the semiconductor elements to be highly integrated, which results in drastic miniaturization. Furthermore, since the multilayer wiring is not necessary to be led out, high-speed fabrication can be realized. Note that, a protection film may additionally be formed so as to cover the conductive layers completed according to the above-described steps. The protection film may be formed of a known material such as an oxide material containing silicon and a nitride material containing silicon. Preferably, a silicon nitride film having dense film quality is employed as the protection film.

According to the invention as set forth above, the first conductive layer 24 is interposed between the insulating layer 22 and the second conductive layer 25 formed by droplet discharging, and hence, the adhesiveness and peel resistance of the conductive layer 25 can be improved. Furthermore, it is possible to prevent thin films under the insulating layer 22 from being damaged and destroyed. The present embodiment mode can be implemented by being freely combined with the above-mentioned embodiment modes.

Embodiment Mode 3

In the present embodiment mode of the invention, a method of manufacturing a thin film transistor applied with the preset invention and a method of manufacturing a display device using the thin film transistor will hereinafter be described with reference to FIGS. 3A to 3D, FIGS. 4A to 4C, FIGS. 5A to 5C, FIGS. 6A to 6D, and FIGS. 7A and 7B. Firstly, a method of manufacturing a channel-etched thin film transistor, in which the present invention is applied to the fabrication of a gate electrode and source and drain wirings, and a method of manufacturing a display device using the thin film transistor will be explained with reference to FIGS. 3A to 3D, and FIG. 5A. The channel-etched thin film transistor is a transistor using an amorphous semiconductor (amorphous silicon (a-Si)) as a channel portion.

Figure 3A:
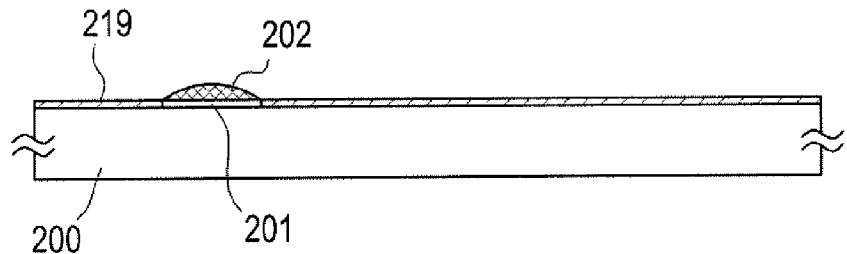
FIGS. 3A to 3D are diagrams explaining a method of manufacturing a channel-etched thin film transistor (Embodiment Mode 3)

On the substrate 200, a conductive layer 201 is formed of a high melting point metal such as Ti, W, Cr, Al, Ta, Ni, Zr, Hf, V, Ir, Nb, Pd, Pt, Mo, Co, and Rh by using a known method (see FIG. 3A). A conductive layer 202 functioning as a gate electrode later is formed by jetting a composition including a conductive material from a droplet discharging means. A part of the conductive layer 201 where is not overlapped with the conductive layer 202 is insulated to form an insulating layer 219. When a step for naturally oxidizing the conductive layer 201 is carried out later, the conductive layer 201 is formed to have a thickness of 0.01 to 10 nm.

Figure 3B:
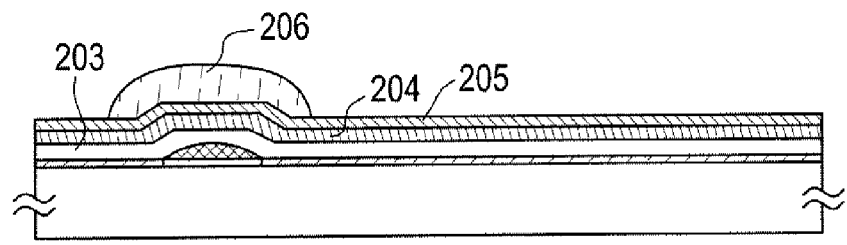
Figure 3C:
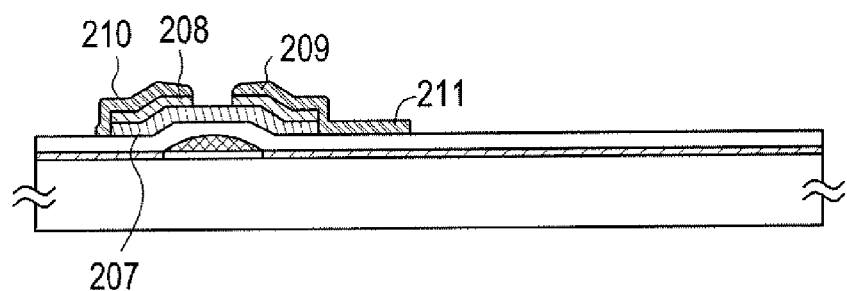
Figure 3D:
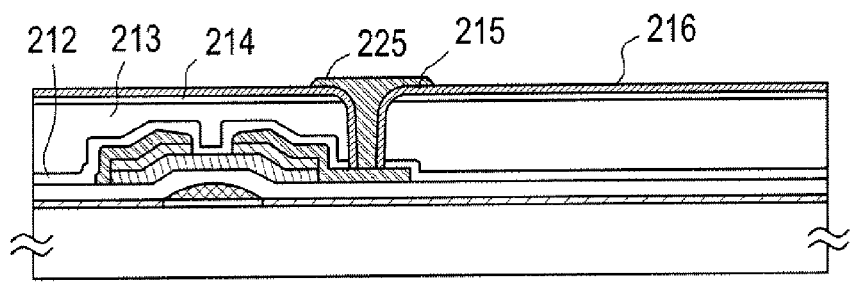

Subsequently, an insulating layer 203 functioning as a gate insulating film, an amorphous semiconductor layer 204, and an n-type amorphous semiconductor layer 205 are laminated (see FIG. 3B). A mask 206 is next made from an insulator such as resist and polyimide. By using the mask 206, the amorphous semiconductor layer 204 and the n-type amorphous semiconductor layer 205 are simultaneously patterned and processed to form an amorphous semiconductor layer 207 and an n-type amorphous semiconductor layer. After removing the mask 206, conductive layers 210 and 211 are formed by discharging a composition including a conductive material. While using the conductive layers 210 and 211 as masks, the n-type amorphous semiconductor layer is patterned and processed so as to form n-type amorphous semiconductor layers 208 and 209 (see FIG. 3C). Although not illustrated in the drawings, a conductive layer composed of a high melting point metal may be provided prior to forming the conductive layers 210 and 211. By forming the conductive layer including the high melting point metal, the adhesiveness and peel resistance of the conductive layers 210 and 211 can be improved.

According to the above-mentioned steps, the channel-etched thin film transistor is completed. Next, insulating layers 212, 213, and 214 are laminated. An opening is then formed in these insulating layers by photolithography (see FIG. 3D). It is preferable that the insulating layer 213 be formed of an organic material or a compound material, which is formed by polymerization, such as siloxane polymer. When the insulating layer 213 is formed of the organic material, the insulating layers 212 and 214 are preferably formed of thin films made from an inorganic material including silicon in order to prevent degasification.

A conductive layer 215 is then formed of a high melting point metal selected from Ti, W, Cr, Al, Ta, Ni, Zr, Hf, V, Ir, Nb, Pd, Pt, Mo, Co, and Rh on the insulating layer 214. Note that, when a step for naturally oxidizing the conductive layer 201 will be performed later, the conductive layer 201 is formed to have a thickness of 0.01 to 10 nm. A conductive layer 225 is next formed by discharging a composition including a conductive material from the droplet discharging means. A part of the conductive layer 215 where is not overlapped with the conductive layer 225 is insulated to form an insulating layer 216.

Subsequently, conductive layers 217 and 218 are formed by discharging a composition including a conductive material so as to be in contact with the conductive layer 225 (see FIG.

5A). The conductive layers 217 and 218 are formed of a conductive material having a light transmitting property. Concretely, these conductive layers are made from indium tin oxide (ITO), and ITSO formed by mixing ITO and silicon oxide. An insulating layer 223, which will serve as a bank, is formed. An electroluminescent layer 220 is formed so as to be in contact with the conductive layer 218. A conductive layer 221 and a light shielding layer 222 are laminated thereon. Thus, a display device having a display function with use of a light emitting element is completed. In the above-mentioned structure, the transistor for driving the light emitting element denotes an n-type transistor, wherein the conductive layer 218 serves as a cathode and the conductive layer 221 serves as an anode. Consequently, a display device performing a so-called bottom emission, in which light generated from the light emitting element is emitted toward the substrate 200, is achieved. In the foregoing manufacturing steps, the conductive layer 201 and the conductive layer 215 are formed of the high melting point metal respectively prior to forming the conductive layers 202 and 225 by droplet discharging, and therefore, the adhesiveness and peel resistance of the conductive layers 202 and 225 can be improved, respectively. As a result, damage and destruction of thin layers under the conductive layers can be prevented. Note that, the conductive layer 215 also functions as a barrier film.

On the other hand, a method of manufacturing a channel-protective thin film transistor, in which the present invention is applied to fabrication of a gate electrode, and a method of manufacturing a display device using the channel-protective thin film transistor will be described with reference to FIGS. 4A to 4C, and FIG. 5B. The channel-protective thin film transistor is a transistor using an amorphous semiconductor as a channel portion.

Figure 4A:
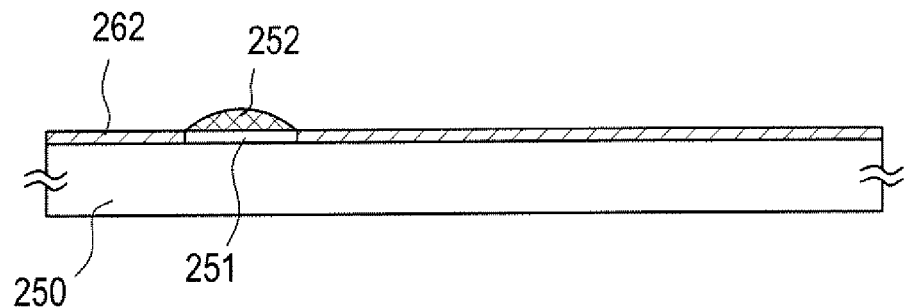
FIGS. 4A to 4C are diagrams explaining a method of manufacturing a channel protective thin film transistor (Embodiment Mode 3)
Figure 4B:
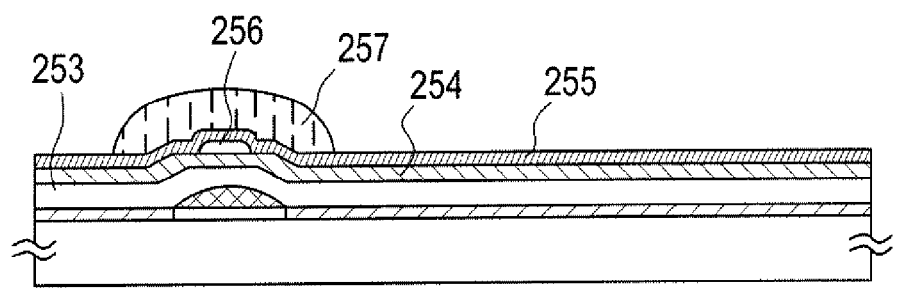
Figure 4C:
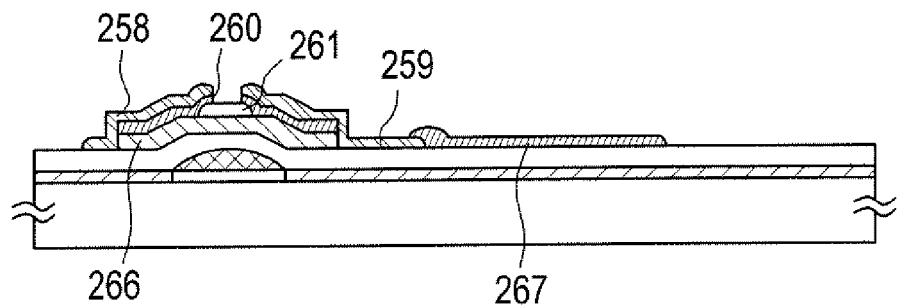

A conductive layer 251 is formed of a high melting point metal on a substrate 250 (see FIG. 4A). A conductive layer 252, which will serve as a gate electrode later, is formed by discharging a composition including a conductive material from a droplet discharging means. A part of the conductive layer 251 where is not overlapped with the conductive layer 252 is oxidized to form an insulating layer 262. When a step for naturally oxidizing the conductive layer 201 is performed later, the conductive layer 201 is formed to have a thickness of 0.01 to 10 nm.

Next, an insulating layer 253, which functions as a gate insulating film, an amorphous semiconductor layer 254, an insulating layer 256, and an n-type amorphous semiconductor layer 255 are laminated (see FIG. 48). The insulating layer 256 may be formed either by photolithography after forming an insulating film over an entire surface of the substrate or by droplet discharging. When the photolithography technique is employed, the insulating layer 256 may be formed by exposing the backside to light with use of the conductive layer 252, which serves as the gate electrode. Accordingly, a step for applying resist can be omitted.

A mask 257 is next formed by using an insulator such as resist and polyimide. By making use of the mask 257, the amorphous semiconductor layer 254 and the n-type amorphous semiconductor layer 255 are simultaneously patterned and processed so as to form an amorphous semiconductor layer 266 and an n-type amorphous semiconductor layer (see FIG. 4C). Conductive layers 258 and 259 are next formed by discharging a composition including a conductive material. While using the conductive layers 258 and 259 as masks, the n-type amorphous semiconductor layer is patterned to form n-type amorphous semiconductor layers 260 and 261.

According to the above-mentioned steps, the channel-protective thin film transistor is completed. Next, a conductive layer 267, which functions as a pixel electrode, is formed by discharging a composition including a conductive material so as to be in contact with the conductive layer 259. An insulating layer 272, which serves as a bank, is formed successively. An electroluminescent layer 270 is formed so as to be in contact with the conductive layer 267, a conductive layer 271 are laminated thereon, and hence, the display device having a display function with use of a light emitting element is completed (see FIG. 5B). In the above-mentioned structure, the transistor for driving the light emitting element corresponds to the n-type transistor, the conductive layer 267 corresponds to an anode, and the conductive layer 271 corresponds to a cathode. Consequently, a display device performing a so-called top emission, in which light generated from the light emitting element is emitted in the opposite direction of the substrate 200, is achieved. According to the foregoing manufacturing steps, since the conductive layer 251 is formed prior to fabricating the conductive layer 252, the adhesiveness and peel resistance of the conductive layer 252 can be improved.

Figure 5A:
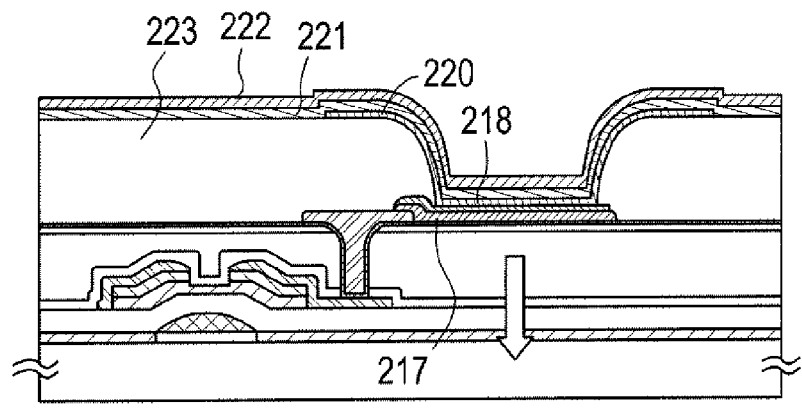
FIGS. 5A to 5C are diagrams explaining a method of manufacturing a display device (Embodiment Mode 3)
Figure 5B:
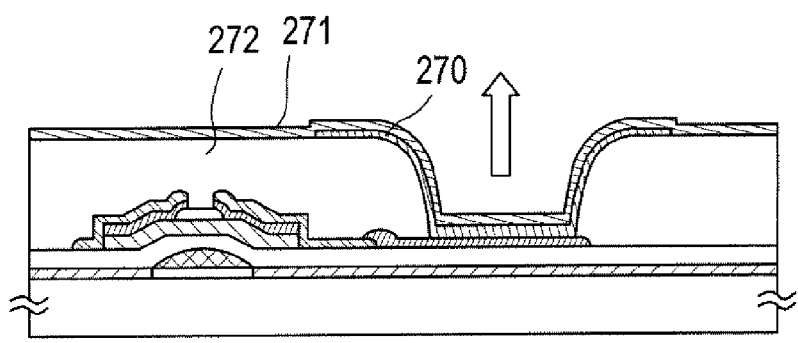
Figure 5C:
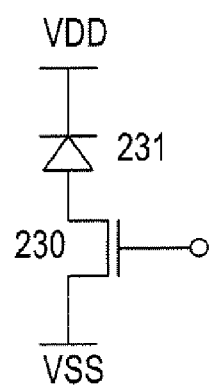
Figure 6A:
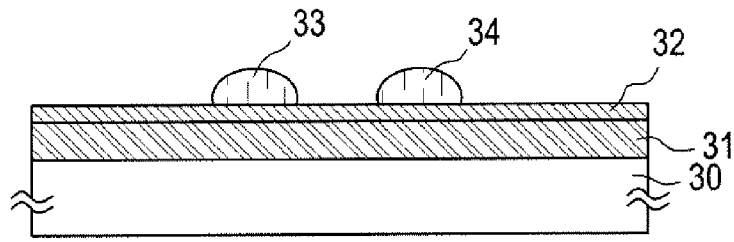
FIGS. 6A to 6D are diagrams explaining a method of manufacturing a staggered thin film transistor (Embodiment Mode 3)
Figure 6B:
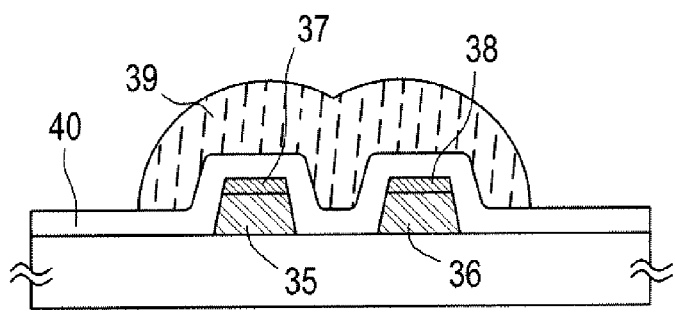
Figure 6C:
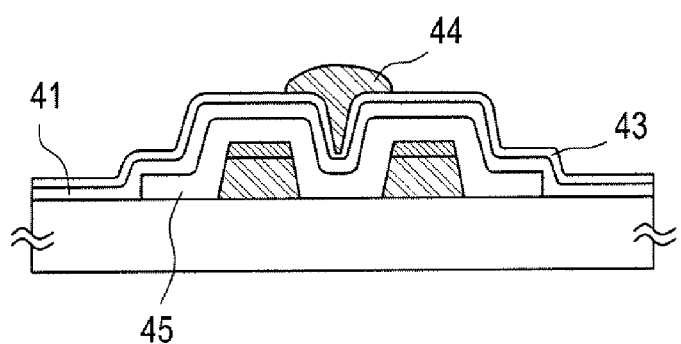
Figure 6D:
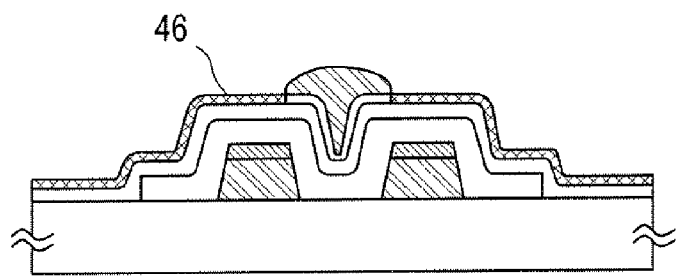

FIG. 5C is an equivalent circuit diagram showing structures illustrated in FIGS. 5A and 5B. Specifically, FIG. 5C shows the equivalent circuit diagram of an n-type driving transistor 230 and a light emitting element 231.

Subsequently, a method of manufacturing a staggered thin film transistor in which the present invention is applied to the fabrication of a gate electrode will be described with reference to FIGS. 6A to 6D. The staggered thin film transistor is a transistor using an amorphous semiconductor as a channel portion.

On a substrate 30, a conductive film 31 is formed of a material such as W, Al, and Ta with a thickness of 100 to 800 nm by a known method of sputtering, CVD, and the like. An n-type amorphous semiconductor 32 is formed with a thickness of 50 to 200 nm by a known method such as plasma CVD (see FIG. 6A). Subsequently, masks 33 and 34 are formed of an insulator such as resist and polyimide. By making use of the masks 33 and 34, the conductive film 31 and the n-type amorphous semiconductor 32 are simultaneously patterned to form conductive layers 35 and 36, and n-type amorphous semiconductor layers 37 and 38. At this moment, these layers are formed so as to have tapered shapes as much as possible, respectively. The masks 33 and 34 are then removed by using an ashing apparatus or a stripping apparatus. A semiconductor 40 is formed with a thickness of 50 to 200 nm by CVD and the like so as to be in contact with the n-type amorphous semiconductor layers 37 and 38 (see FIG. 6B). The semiconductor 40 may be formed of an amorphous semiconductor or a semiamorphous semiconductor (hereinafter referred to as SAS), in which crystal grains are dispersed in an amorphous semiconductor.

The transistor using the SAS has the electron field-effect mobility of 2 to 20 $cm^2/V \cdot sec$, which is 2 to 20 times as large as that of the transistor using the amorphous semiconductor, and has an intermediate structure between an amorphous structure and a crystalline structure (including a single crystal and poly crystal). The SAS further includes a third condition that is stable in terms of free energy, and a crystalline structure having short-range order along with lattice distortion. Therefore, the crystal grains having a grain size of from 0.5 to 20 nm can be dispersed in the amorphous semiconductor. Further, the SAS is added with hydrogen or halogen of at least 1 atom % or more as a neutralizing agent for dangling bonds. The more favorable and stable SAS can be obtained by being added with a rare gas element such as helium, argon, krypton, and neon to promote the lattice distortion.

Subsequently, a mask 39 is formed. By using the mask 39, the semiconductor 40 is patterned and processed to form a semiconductor layer 45 (see FIG. 6C). After removing the mask 39, an insulating film 41, which serves as a gate insulating film, is formed with a thickness of 40 to 200 nm by a known method such as CVD. A conductive layer 43 is next formed with a thickness of 0.5 to 10 nm by a known method such as sputtering and CVD. Successively, a conductive layer 44 is formed by discharging a composition including a conductive material. A baking step is then carried out, if necessary. A part of the conductive layer 43 where is not overlapped with the conductive layer 44 is insulated so as to form an insulating layer 46 (see FIG. 6D).

According to the above-mentioned steps, a thin film transistor is completed. In the foregoing steps, since the thin conductive layer 43 is formed prior to forming the conductive layer 44, the adhesiveness and peel resistance of the conductive layer 44 can be improved.

As depicted in FIGS. 3A to 3D, FIGS. 4A to 4C, and FIGS. 5A to 5C, a display element such as a light emitting element and a liquid crystal element may also be formed at an upper layer of the thin film transistor. Therefore, a display device having a display function can be completed.

Figure 7A:
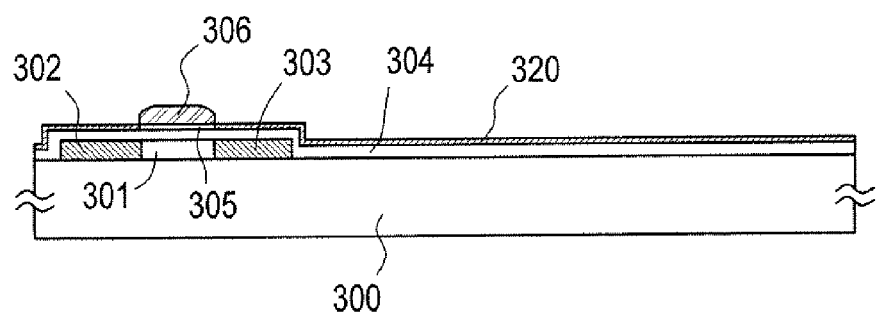
FIGS. 7A and 7B are diagrams explaining a method of manufacturing a staggered thin film transistor and a display device (Embodiment Mode 3)
Figure 7B:
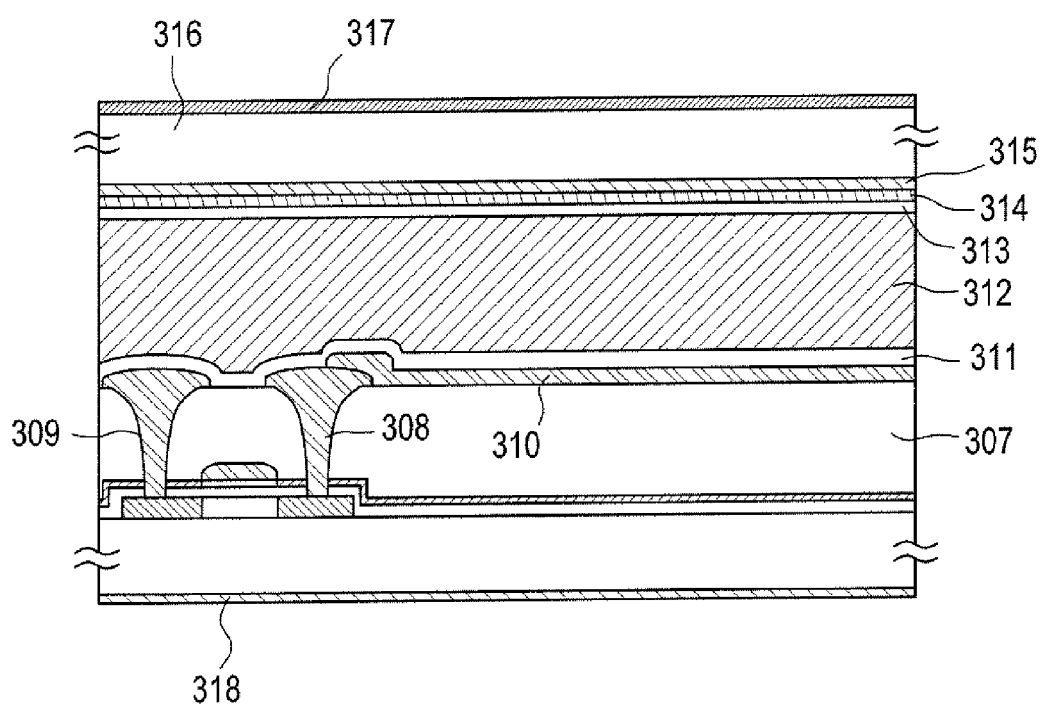

Subsequently, a method of manufacturing a top-gate thin film transistor, in which the present invention is applied to the fabrication of a gate electrode, will be described referring to FIGS. 7A and 7B. The top-gate thin film transistor is a transistor using a polycrystalline semiconductor as a channel portion.

An amorphous semiconductor is formed on a substrate 300, and crystallized by using a known crystallization method such as laser crystallization so as to form a polycrystalline semiconductor. An insulating layer 304 is formed on the polycrystalline semiconductor (see FIG. 7A). An insulating film is preferably formed on the substrate 300 as a base film to prevent the ingress of impurities from the substrate 300, if necessary. A conductive layer 305 is next formed of a high melting point metal on the insulating layer 304. When a step for naturally oxidizing the conductive layer 305 will be carried out later, the conductive layer 305 is formed to have a thickness of 0.01 to 10 nm. A conductive layer 306, which will serve as a gate electrode later, is formed by discharging a composition including a conductive material from a droplet discharging means. A part of the conductive layer 305, where is exposed from the conductive layer 306, is insulated to form an insulating layer 320. By making use of the conductive layer 306 as a mask, an impurity is doped to the semiconductor such that impurity regions 302 and 303 added with the impurity and a channel formation region 301 are formed.

An insulating layer 307 is next formed. Openings are formed in the insulating layer 307 by photolithography. A composition including a conductive material is discharged into the openings to form conductive layers 308 and 309. A conductive layer 310, which functions as a pixel electrode, is formed so as to be in contact with the conductive layer 308. An orientation film 311 is next formed. Another substrate 316 on which a color filter 315, an opposing electrode 314, and an orientation film 313 are formed is prepared. The substrate 300 and the substrate 316 are adhered to each other with a sealing agent (not illustrated in the drawings) by thermally curing the sealing agent. A liquid crystal 312 is injected between the pair of substrates, and hence, a display device having a display function with use of a liquid crystal element is completed. Each side of the substrates 316 and 300 is attached with polarizing plates 317 and 318. According to the above-described steps, the thin conductive layer 305 is formed prior to forming the conductive layer 306, and therefore, the adhesiveness and peel resistance of the conductive layer 306 can be improved. The present embodiment mode can be implemented by being freely combined with the foregoing embodiment modes.

Embodiment 1

The present embodiment explains experimental results for evaluating the adhesiveness of a conductive layer formed according to the present invention, and results for measuring the light transmittance of the conductive layer. Firstly, a method of manufacturing twenty-five kinds of samples in total, which are used for respective experiments, will be explained as follows. Thin titanium (Ti) films are formed on twenty quartz substrates in total by sputtering to have thicknesses of 0.5 nm, 1.0 nm, 2.0 nm, and 5.0 nm, respectively. Subsequently, wirings having a line width of 200 μm are formed on the titanium films respectively by discharging a composition containing silver. Meanwhile, five substrates on which the thin Ti films are not formed are prepared: and then wirings having a line width of 200 μm are directly formed thereon by discharging the composition containing silver. As a first heat treatment, the twenty-five samples are baked at a temperature of 230° C. for one hour. Thereafter, the twenty samples of the resultant twenty-five samples are baked under the following different conditions as a second heat treatment: five samples are heated at 250° C. for one hour; five samples are heated at 300° C. for one hour; five samples are heated at 350° C. for one hour; and five samples are heated at 410° C. for one hour. Note that, one sample of the twenty-five samples does not have a titanium film and is not subjected to the second heat treatment. Two experiments of a taping test and another test for a hydrofluoric acid treatment are carried out on the twenty-five kinds of samples in total formed described above such that the adhesiveness for each sample is evaluated.

The results of the taping test will be explained. The taping test is one for evaluating the adhesiveness in such a manner that: the middle of each wiring composed of the composition containing silver is cut with a cutting instrument, a tape is attached firmly to each entire surface of the wirings, and then the attached tape is peeled off from the surfaces by a physical means. The evaluation results are shown in Table 1. As shown in Table 1, in the case of the samples in which no titanium film is formed, each wiring is peeled off under any temperature conditions. On the other hand, in the case of the samples including the titanium films, each wiring is not peeled off under all temperature conditions. According to the results above, the titanium film is well adhered to the composition containing silver. Furthermore, the adhesiveness between the titanium film and the composition containing silver is favorable even when the titanium films are extremely thin in film thicknesses (0.5 nm and 1.0 nm).

TABLE 1

|  |  | Temperature for heat treatment | | | | |
|---|---|---|---|---|---|---|
|  |  | none | 250° C. | 300° C. | 350° C. | 410° C. |
| Thickness of titanium film | none | X | X | X | X | X |
|  | 0.5 nm | ○ | ○ | ○ | ○ | ○ |
|  | 1.0 nm | ○ | ○ | ○ | ○ | ○ |
|  | 2.0 nm | ○ | ○ | ○ | ○ | ○ |
|  | 5.0 nm | ○ | ○ | ○ | ○ | ○ |

X: the wiring is entirely removed.
Δ: the wiring is partly removed.

Next, the evaluation results with respect to the test for the hydrofluoric acid treatment will be described. The test for the hydrofluoric acid treatment is carried out as follows: each sample is soaked in hydrofluoric acid, and then the degree of peeling for each wiring is examined. The hydrofluoric acid treatment is performed for 10 seconds. When the wiring is not peeled off, the hydrofluoric acid treatment for 10 seconds is repeatedly carried out. Table 2 shows the evaluation results thereof. As shown in Table 2, in the case of the samples including the titanium films, each wiring is not peeled off even when the samples are subjected to the hydrofluoric acid treatments of nine times, i.e., the hydrofluoric acid treatment for 90 seconds in total. On the other hand, in the case of the samples including no titanium films, which are heated at 250° C. for one hour as the second heat treatment, each of the wirings is peeled off after the hydrofluoric acid treatments of eight times, i.e., the hydrofluoric acid treatment for 80 seconds in total. Furthermore, in the case of the samples including no titanium films, which are heated at 300° C. for one hour as the second heat treatment, each of the wirings is peeled off after the hydrofluoric acid treatments of six times, i.e., the hydrofluoric acid treatment for 60 seconds in total. In accordance with the above-mentioned results, it is revealed that the adhesiveness between the titanium film and the composition containing silver is favorable.

TABLE 2

| | | Temperature for heat treatment | | | |
|---|---|---|---|---|---|
| | | none | 250° C. | 300° C. | 350° C. | 410° C. |
| Thickness of titanium film | none | ○ | 80 sec | 60 sec | ○ | ○ |
| | 0.5 nm | ○ | ○ | ○ | ○ | ○ |
| | 1.0 nm | ○ | ○ | ○ | ○ | ○ |
| | 2.0 nm | ○ | ○ | ○ | ○ | ○ |
| | 5.0 nm | ○ | ○ | ○ | ○ | ○ |

○: the wiring is not removed after soaking the sample in hydrofluoric acid for 90 seconds.
the number of seconds: time for soaking the sample in hydrofluoric acid until the wiring is removed.

Although not shown in Table 2, the titanium films are not peeled off even when the samples including the titanium films are soaked in a remover at a temperature of 80° C. and then soaked in an isopropyl alcohol solution for 6 minutes at ambient temperatures. Finally, the results of measuring the light transmittance will be described. According to the measurement results, the light transmittance of each sample, on which the titanium films are not formed, is approximately 1. As the thickness of the titanium film is increased, the light transmittances tend to be decreased. However, there is not significant difference in the light transmittances depending on the conditions of the heat treatment, and all samples comprise light transmitting properties.

Embodiment 2

According to the invention, a thin film transistor can be formed, and a display device can be formed with use of the thin film transistor. When a light emitting element is used as a display element and a p-type transistor is used as a transistor for driving the light emitting element, light generated from the light emitting element is emitted toward a bottom surface, toward a top surface, or toward both surfaces. In the present embodiment, lamination structures of the light emitting element according to any cases of bottom emission, top emission, and dual emission will be described.

Figure 8A:
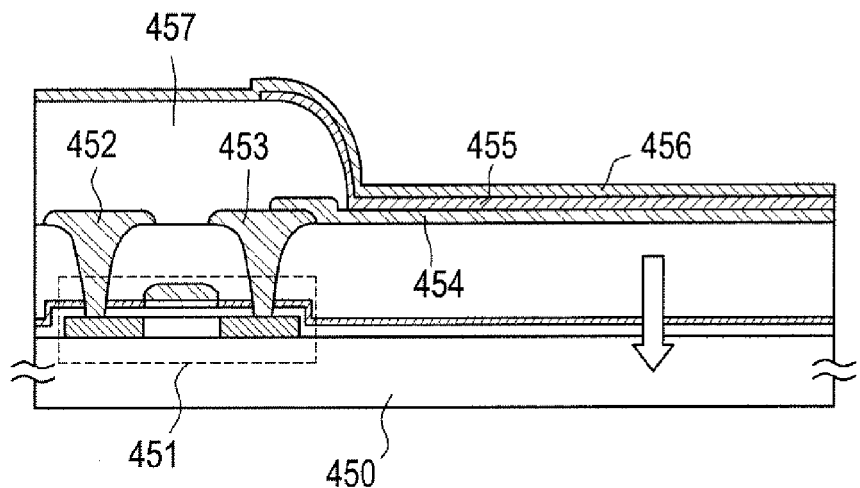
FIGS. 8A to 8C are diagrams explaining lamination structures of a staggered thin film transistor and a light emitting element, which is connected to the staggered thin film transistor (Embodiment 2)
Figure 8B:
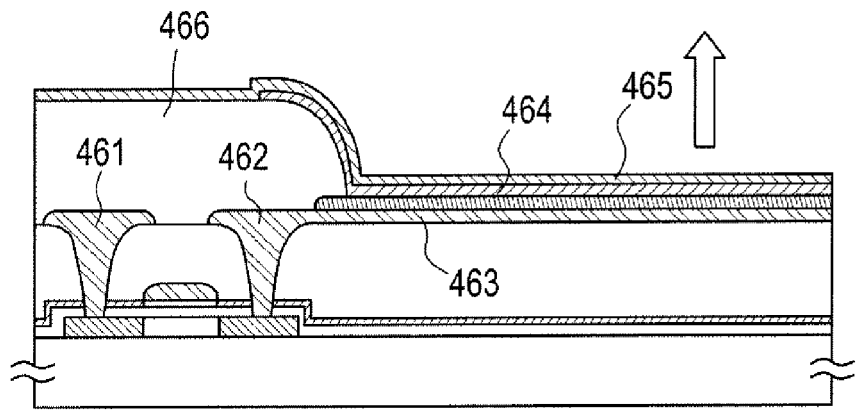
Figure 8C:
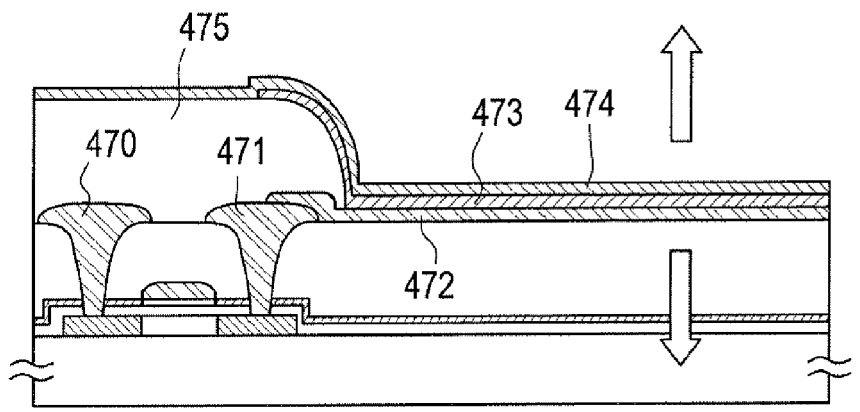

The bottom emission, in which light generated from the light emitting element is emitted toward a substrate 450, is explained referring to FIG. 8A. In this case, source and drain wirings 452 and 453 being electrically connected to a transistor 451, an anode 454, an electroluminescent layer 455, and a cathode 456 are sequentially laminated over the substrate 450. A case of the top emission, in which light is emitted toward an opposite direction of the substrate 450, is described with reference to FIG. 8B. Source and drain wiring 461 and 462 being electrically connected to a transistor 451, an anode 463, an electroluminescent layer 464, and a cathode 465 are sequentially laminated over a substrate 450. According to the structure, even when light passes through the anode 463, the light is reflected by the wiring 462 so as to be emitted toward the opposite direction of the substrate 450. In this structure, the anode 463 is not necessary to be formed of a light-transmitting material. A case of the dual emission, in which light is emitted both toward the substrate and toward the opposite direction of the substrate, is explained with reference to FIG. 8C. Source and drain wirings 470 and 471 being electrically connected to a transistor 451, an anode 472, an electroluminescent layer 473, and a cathode 474 are sequentially laminated over the substrate 450. In this structure, the anode 472 and the cathode 474 are formed of a light-transmitting material or formed with thin film thicknesses, which can transmit light, such that the dual emission can be realized.

In the above-mentioned structures, the cathodes 456, 465, 474 can be formed of a material with low work function. For example, these cathodes are desirably formed of Ca, Al, CaF, MgAg, AlLi, and the like. The electroluminescent layers 455, 464, and 473 may have any one of a single-layer structure, a lamination structure, and a mixed structure having no interface between layers. Further, the electroluminescent layers may be formed of any material such as a singlet material; a triplet material; a material with a combination of the singlet and triplet materials; an organic material including a low-molecular weight material, a high-molecular weight material, and an intermediate-molecular weight material; an inorganic material typified by molybdenum oxide, which is superior in an electron injecting property, and the like; and a hybrid material of the organic material and inorganic material. The anodes 454, 463, 472 are formed of a transparent conductive film, which transmits light. For example, the anodes are formed of a transparent conductive film, in which indium oxide is mixed with zinc oxide (ZnO) of 2 to 20%, besides ITO, and ITSO. It is preferable that a plasma treatment be carried out under an oxygen atmosphere or a heat treatment be performed under vacuum atmosphere prior to forming the anodes 454, 463, and 472. Partition walls 457, 466, and 475 are formed of a material including silicon, an organic material, or a compound material. When the partition walls are formed of a photosensitive or nonphotosensitive material such as acrylic and polyimide, the curvature radius for each side surface thereof is gently varied. Therefore, a thin film formed on each partition wall is not disconnected. Accordingly, it is preferable that the partition walls be formed of the photosensitive or nonphotosensitive material. The present invention can be implemented by being freely combined with the above-mentioned embodiment modes.

Embodiment 3

Figure 9A:
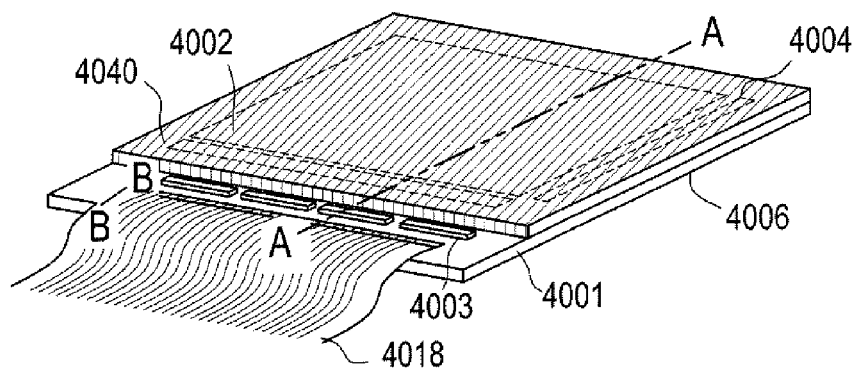
FIG. 9A is a top view of a panel which is one embodiment of a semiconductor device according to the present invention.

An external appearance of a panel which is one embodiment of a semiconductor device according to the invention will be described with reference to FIGS. 9A to 9C. FIG. 9A is a top view of the panel, FIG. 9B is a cross sectional view taken along a line A-A' of FIG. 9A, and FIG. 9C is a cross sectional view taken along a line B-B' of FIG. 7A.

Figure 9B:
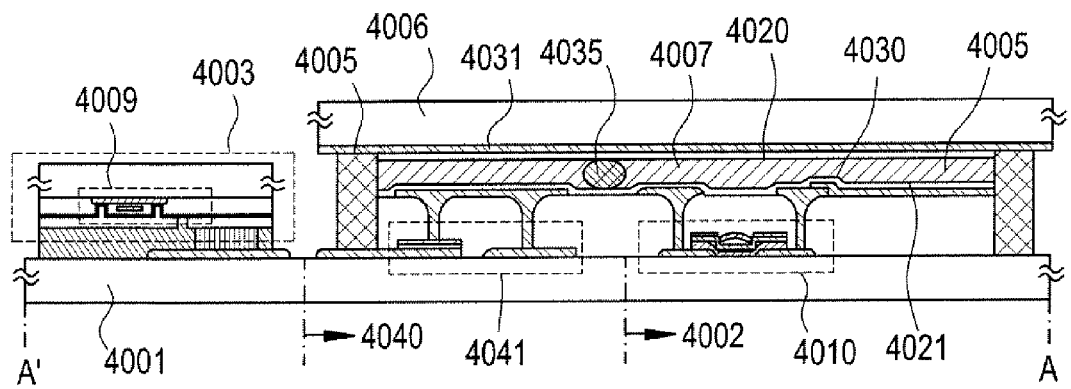
FIGS. 9B and 9C are cross sectional views thereof (Embodiment 3)

As depicted in FIGS. 9A and 9B, a pixel portion 4002, a scanning line driver circuit 4004, and a protection circuit 4040 are formed over a first substrate 4001. A sealing agent 4005 is formed so as to surround these elements. The first substrate 4001 is sealed with a second substrate 4006 along with a liquid crystal 4007. A signal line driver circuit 4003 is formed of a polycrystalline semiconductor over another substrate, which is separately prepared. The signal line driver circuit 4003 is mounted on the first substrate 4001 at a region other than the region surrounded by the sealing agent 4005. The pixel portion 4002 and the scanning line driver circuit 4004 have a plurality of TFTs. FIG. 9B only shows a TFT 4010 in the pixel portion 4002 and an element group 4041 including a diode and a resistor element in the protection circuit 4040. The TFT 4010 uses an amorphous semiconductor as a channel portion. A portion, in which a pixel electrode 4030 being electrically connected to the TFT 4010, an opposing electrode 4031 formed on the second substrate 4006, and the liquid crystal 4007 are overlapped, corresponds to a liquid crystal element. Orientation films 4020 and 4021 are provided so as to be in contact with the pixel electrode 4030 and the opposing electrode 4031. A spacer 4035 is provided for the purpose of controlling the distance between the pixel electrode 4030 and the opposing electrode 4031. FIG. 9B shows a TFT 4009 composed of a polycrystalline semiconductor, which is included in the signal line driver circuit 4003 by way of example. It should be note that several structures with respect to the protection circuit 4040 will be described in more detail in Embodiment 5.

Figure 9C:
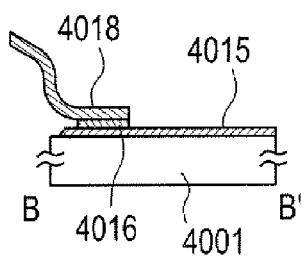

As shown in FIG. 9C, various signals supplied to the signal line driver circuit 4003 provided separately, the scanning line driver circuit 4004, and the pixel portion 4002 are supplied from a connection terminal 4015. The connection terminal 4015 is connected to an FPC 4018 via an anisotropic conductor 4016. The panel comprises a structure in which the signal line driver circuit 4003 having the TFT composed of the polycrystalline semiconductor is attached to the first substrate 4001. Rather than the polycrystalline semiconductor, a driver circuit having a TFT composed of a monocrystalline semiconductor may be adhered to the first substrate 4001. Further, a scanning line driver circuit, which is separately formed over another substrate, may be mounted on the first substrate 4001. Or, only a part of the signal line driver circuit or a part of the scanning line driver circuit may be separately formed on another substrate, and then mounted on the first substrate. In the above-mentioned panel, the pixel portion 4002 and the scanning line driver circuit 4004 are integrated over the substrate 4001. Elements constituting such structure preferably use TFTs each of which comprises a polycrystalline semiconductor or a semiamorphous semiconductor (hereinafter referred to as SAS) as a channel portion. The TFT using the SAS as the channel portion has higher mobility than that of a TFT using an amorphous semiconductor as a channel portion. Therefore, the TFT using the SAS as the channel portion sufficiently constitutes the scanning line driver circuit 4004. Although not illustrated in the drawing, a polarizing plate, a color filter, and a light shielding film may additionally be provided to the above-mentioned panel. The case in which the liquid crystal element is used as a display element is illustrated in the drawings. However, the present invention may be applied to a semiconductor device using the other display elements such as a light emitting element.

Next, another external appearance of a panel which is one embodiment of a semiconductor device differing to the above-described embodiment, will be described with reference to FIGS. 12A and 12B. FIG. 12A is a top view of a panel, and FIG. 12B is a cross sectional view taken along a line A-A' of FIG. 12A.

As depicted in FIGS. 12A and 12B, a sealing agent 5006 is provided over a first substrate 5001 so as to surround a pixel portion 5003, and driver circuits 5004 and 5005. After forming a resin film 5015 on the elements formed over the first substrate 5001, these elements are sealed with a second substrate 5002. FIG. 12B only exemplifies a CMOS circuit 5010 included in a signal line driver circuit 5005; and a TFT 5011 and a light emitting element 5012 included in a pixel portion 5003. Various signals supplied to each circuit formed over the first substrate 5001 are supplied from a connection terminal 5007.

In the above-mentioned panel, the light emitting element 5012 is sealed with a glass substrate. The sealing treatment is a treatment for protecting the light emitting element from moisture. Therefore, following methods can also be used for sealing the light emitting element: a method for mechanically sealing the light emitting element with a cover member; a method for sealing the light emitting element with a thermosetting resin or an ultraviolet curable resin; and a method for sealing the light emitting element with a thin film having high barrier function such as metal oxide and metal nitride. As for the cover member, any material such as glass, ceramic, plastic, and metal can be used. When light is emitted toward the cover member side, the cover member should have a light transmitting property. The cover member and the substrate with the above-mentioned light emitting element formed thereon are adhered to each other with a sealing agent such as a thermosetting resin and an ultraviolet curable resin. The sealing agent is cured by a heat treatment or an ultraviolet irradiation treatment so as to form a hermetically enclosed space. It is also effective that a hygroscopic material typified by barium oxide is provided in the hermetically enclosed space. Furthermore, a space between the cover member and the substrate with the light emitting element formed thereon can be filled with the thermosetting resin or the ultraviolet curable resin. In this case, it is effective that the hygroscopic material typified by barium oxide be added into the thermosetting resin or the ultraviolet curable resin.

Embodiment 4

Figure 13:
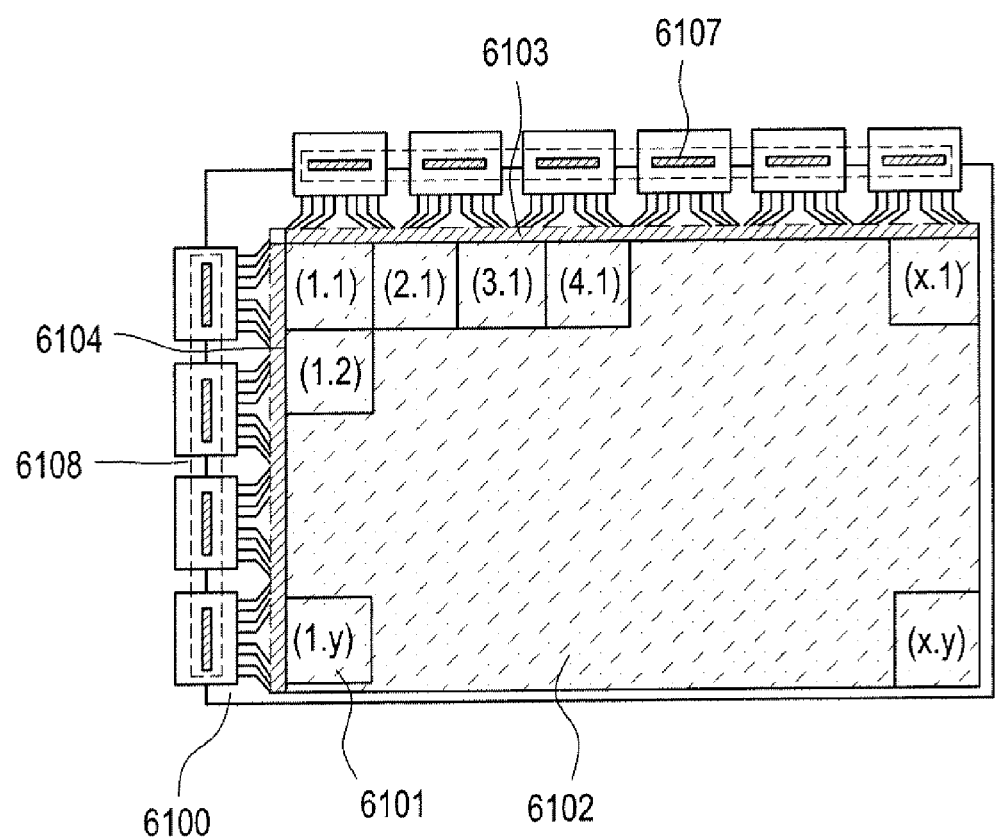
FIG. 13 is a diagram showing a semiconductor device applied with the present invention (Embodiment 4)

A structure of a semiconductor device having a display function according to the present invention will be described with reference to FIG. 13. FIG. 13 is a top view explaining a simple overview of the semiconductor device, wherein a pixel portion (display portion) 6102, and protection circuits 6103 and 6104 are formed over a substrate 6100. These elements are connected to a driver IC 6107 on a signal line side and a driver IC 6104 on a scanning line side via a lead wiring. In the case where an amorphous semiconductor or a microcrystalline semiconductor is used as an element constituting the pixel portion 6102 as illustrated in the drawing, it is preferable that the driver ICs 6107 and 6108 be mounted over the substrate by using known technologies such as COG and TAB, and these driver ICs be used as driver circuits. When the microcrystalline semiconductor is used as an element constituting the pixel portion 6102, the driver circuit on the scanning line side may be composed of the microcrystalline semiconductor whereas the driver IC 6107 may be mounted on the signal line side as the driver circuit. As a structure different from the above-mentioned structures, a part of the driver circuit on the scanning line side and a part of the driver circuit on the signal line side may be integrated over a same substrate and the driver ICs may be used in place of another parts for the driver circuit. That is, there are various structures for mounting the driver ICs, and the invention may employ any structures.

Figure 14A:
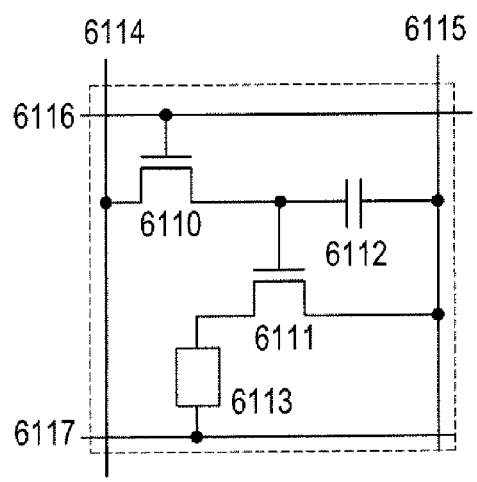
FIGS. 14A to 14C are diagrams showing a pixel circuit of a semiconductor device applied with the present invention (Embodiment 4)

A pixel circuit of a semiconductor device having a display function according to the invention will hereinafter be described with reference to FIGS. 14A to 14C. FIG. 14A is an equivalent circuit diagram of a pixel 6101. The pixel 6101 comprises a TFT 6110 controlling input of a video signal into the pixel 6101; a TFT 6111 controlling the amount of electric current that flows though a pair of electrodes for a light emitting element 6113; and a capacitor element 6112 for storing gate-source voltage of the TFT 6111 in a region surrounded by a signal line 6114, power supply lines 6115 and 6117, and a scanning line 6116. Although the capacitor element 6112 is formed in the pixel 6101 in FIG. 5B, the present invention is not limited thereto. When a gate capacitance or the other parasitic capacitance of the TFT 6111 can serve as a capacitor for holding the gate-source voltage, the capacitor element is not necessarily provided.

Figure 14B:
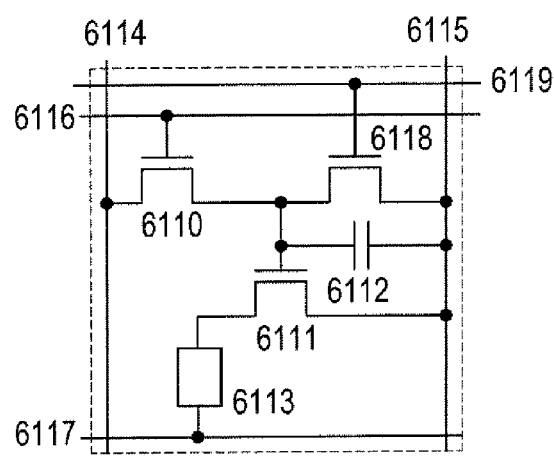

FIG. 14B shows a pixel circuit having a structure in which a TFT 6118 and a scanning line 6119 are newly added to the structure of the pixel 6101 as illustrated in FIG. 14A. By providing the TFT 6118, supply of the electric current to the light emitting element 6113 can be forcibly stopped. Accordingly, a lighting period can start simultaneously with or immediately after a writing period starts before signals are written into all the pixels. Consequently, the duty ratio is improved. In particular, moving images can be displayed favorably in accordance with the configuration.

Figure 14C:
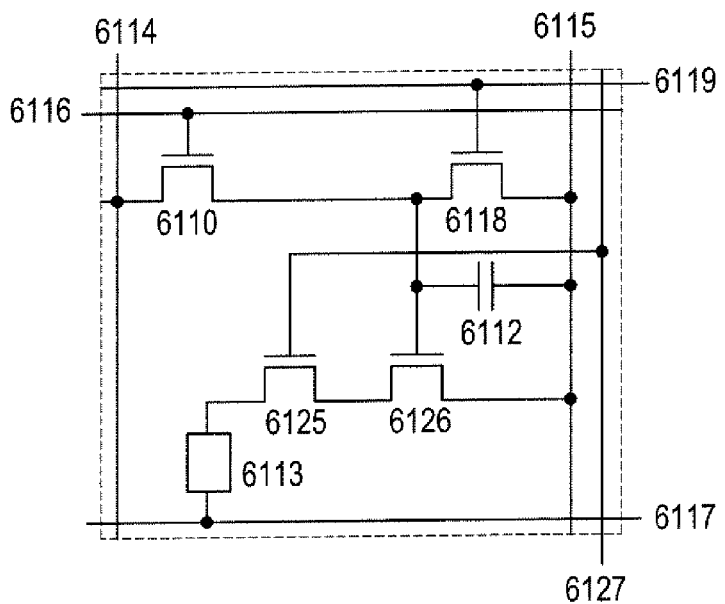

FIG. 14C shows a pixel circuit having a structure in which a TFT 6125, a TFT 6126, and a wiring 6127 are newly added to the pixel 6101 as illustrated in FIG. 14B, though the transistor 6111 is removed. In this structure, a gate electrode of the TFT 6125 is connected to the wiring 6127 storing a constant electric potential such that the electric potential for the gate electrode is fixed. Further, the TFT 6125 is operated in a saturation region. The TFT 6126 is connected to the TFT 6125 in series and operated in a linear region. A gate electrode of the TFT 6126 is input with video signals for transmitting information about lighting or non-lighting of the pixel via the TFT 6110. Since the source-drain voltage for the TFT 6126 that is operated in the linear region is low, slight variation in the gate-source voltage of the TFT 6126 does not adversely affect the amount of electric current flowing through the light emitting element 6113. Accordingly, the amount of electric current flowing through the light emitting element 6113 is determined by the TFT 6125, which is operated in the saturation region. According to the invention having the above-mentioned structure, luminance fluctuation of the light emitting element 6113, which is caused by fluctuation in the characteristics of the TFT 6125, can be improved, thereby enhancing the image quality. It is preferable that the channel length $L_1$ and the channel width $W_1$ for the TFT 6125, and the channel length $L_2$ and the channel width $W_2$ for the TFT 6126 be set so as to satisfy the relation of $L_1/W_1:L_2/W_2=5$ to 6,000:1. It is also preferable that the TFTs 6125 and 6126 comprise a same conductivity type from the viewpoint of the manufacturing steps. Further, the TFT 6125 may be either an enhancement TFT or a depletion TFT.

Figure 16A:
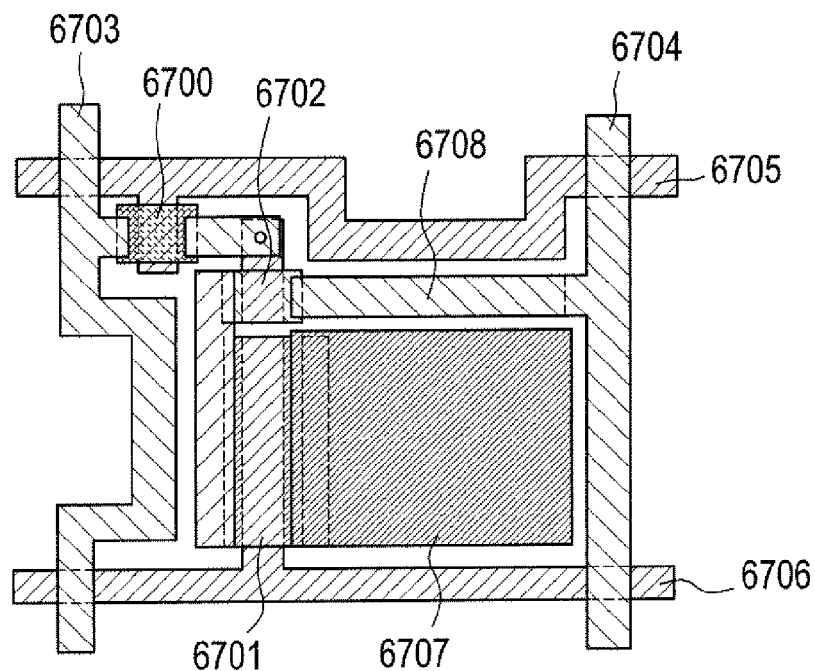
FIG. 16A is a top view of a pixel circuit of a semiconductor device according to the invention.
Figure 16B:
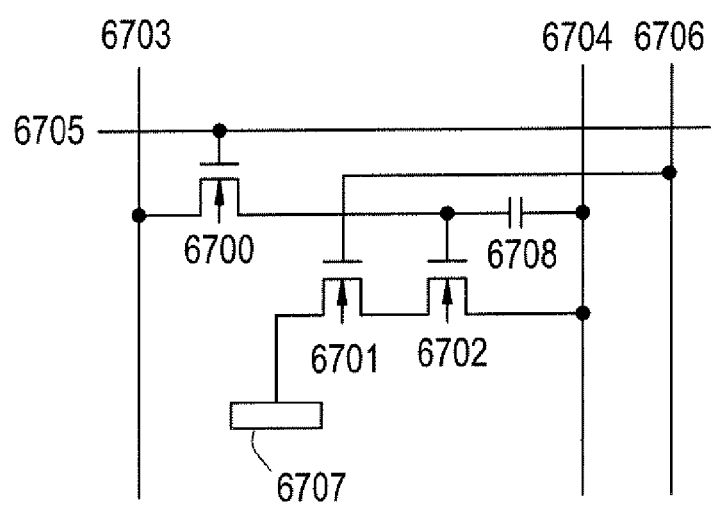
FIG. 16B is an equivalent circuit diagrams thereof (Embodiment 4).

FIG. 16A is a top view of a pixel circuit having the above-mentioned structure and FIG. 16B is an equivalent circuit diagram thereof. In FIGS. 16A and 16B, TFTs 6700, 6701, and 6702, and a capacitor element 6708 are formed in a region surrounded by a signal line 6703, a power supply line 6704, a scanning line 6705, and another power supply line 6706. A pixel electrode 6707 is connected to a source or drain of the TFT 6701.

The display device having the display function of the invention may use either analog video signals or digital video signals. When the digital video signals are employed the method of inputting the digital video signals into the display device is varied depending on the case where the video signals use the voltage and the case where the video signals use the electric current. That is, luminescence is emitted from the light emitting element either by inputting the video signals into pixels with constant voltage or by inputting the video signals into the pixels with constant current. The method of inputting the video signals with constant voltage includes the one in which constant voltage is applied to the light emitting element and the one in which constant current flows through the light emitting element. Further, the method of inputting the video signals with constant current includes the one in which constant voltage is applied to the light emitting element and the one in which the constant current flows through the light emitting element. The driving method in which constant voltage is applied to the light emitting element indicates a constant voltage drive, whereas the driving method in which constant current flows through the light emitting element indicates a constant current drive. With respect to the constant current drive, constant current flows regardless of variation in resistance for the light emitting element. The display device and the method of driving thereof according to the invention may employ either video signals using voltage or video signals using the electric current. Furthermore, either the constant voltage drive or the constant current drive may be used. The present invention can be implemented by being freely combined with the above-mentioned embodiment modes and embodiments.

Embodiment 5

Figure 15A:
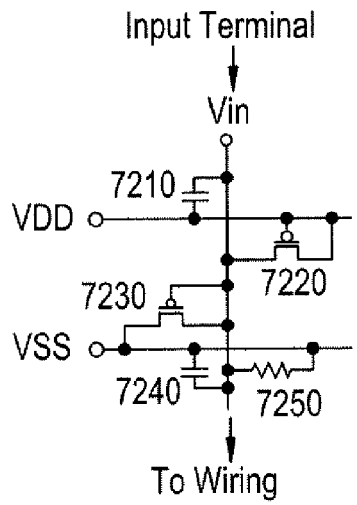
FIGS. 15A to 15E are diagrams showing a protection circuit equipped to a semiconductor device according to the invention (Embodiment 5)

An example of a protection circuit included in the semiconductor device of the invention will be described. The protection circuit is composed of one or a plurality of elements selected from a TFT, a diode, a resistor element, a capacitance element, and the like. Several structures and operation of the protection circuit will hereinafter be explained. A structure of a protection circuit arranged between an external circuit and an internal circuit corresponding to one input terminal is described with reference to an equivalent circuit diagram of FIG. 15A. The protection circuit in FIG. 15A comprises p-type TFTs 7220 and 7230, capacitor elements 7210 and 7240, and a resistor element 7250. The resistor element 7250 is a resistor with two terminals, wherein one end of the resistor element is supplied with an input voltage (hereinafter referred to as Vin) and the other end is supplied with a low potential voltage (hereinafter referred to as VSS). The resistor element 7250 is provided so as to reduce the electric potential of the wiring to VSS when the input terminal is not supplied with the Vin. The resistance is sufficiently set at a higher value than the wiring resistance of the wiring.

When the Vin is higher than the high potential voltage (hereinafter, referred to as VDD), the TFT 7220 is turned ON and the TFT 7230 is turned OFF in relation to the gate-source voltage. Accordingly, the VDD is supplied to the wiring through the TFT 7220. Therefore, voltage supplied to the wiring does not exceed the VDD even when the Vin exceeds the VDD due to noise and the like. On the other hand, when the Vin is lower than the VSS, the TFT 7220 is turned OFF and the TFT 7230 is turned ON in relation to the gate-source voltage. Accordingly, the VSS is supplied to the wiring. Therefore, the voltage supplied to the wiring does not exceed the VDD even when the Vin becomes lower than the VDD due to noise and the like. Furthermore, since pulse noise can be dulled in the voltage supplied from the input terminal because of the capacitor elements 7210 and 7240, a sudden change of voltage due to noise can be reduced to some extent.

According to the arrangement of the protection circuit in the above structure, voltage of the wiring is kept in a range between the VSS and the VDD, and protected from the application of excessively low or high voltage outside the range. Furthermore, the protection circuit is provided to the input terminal input with signals such that voltage of all wirings that is supplied with signals can be kept at a constant level (at the VSS in this embodiment) when input of signals is stopped. That is, the protection circuit functions as a short ring, which can make the wirings short circuits one another when signals are not input in the input terminal. Therefore, electrostatic damage due to voltage difference between wirings can be prevented. In addition, when signals are inputted, the signals supplied to the wiring are not dragged to the VSS since resistance of the resistor element 7250 is at an enough high level.

Figure 15B:
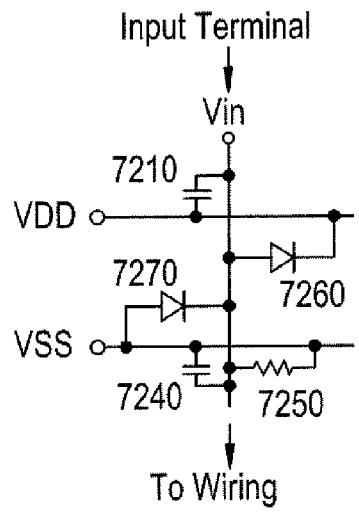
Figure 15C:
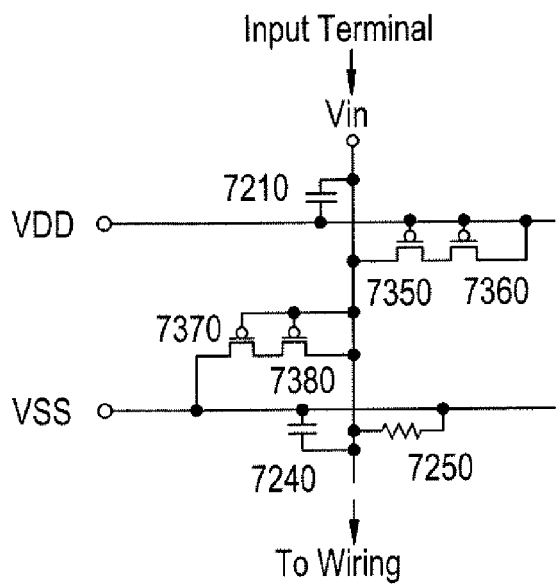
Figure 15D:
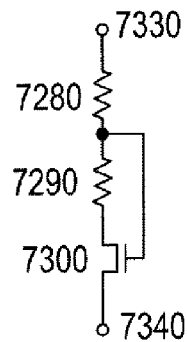
Figure 15E:
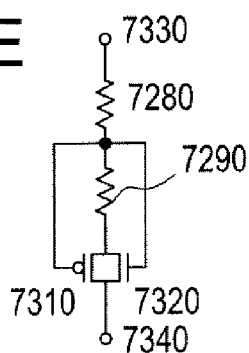

FIG. 15B shows an equivalent circuit diagram of a protection circuit in which the p-type TFTs 7220 and 7230 are replaced by diodes 7260 and 7270 having rectification. An equivalent circuit diagram in FIG. 15C shows a protection circuit in which the p-type TFT 7220 and the p-type TFT 7230 are replaced by a TFT 7350, a TFT 7360, a TFT 7370, and a TFT 7380. FIG. 15D shows a protection circuit having a different structure of the above structures, which comprises a resistor element 7280, a resistor element 7290, and an n-type TFT 7300. A protection circuit shown in FIG. 15E comprises resistor elements 7280 and 7290, a p-type TFT 7310, and an n-type TFT 7320. In each structure of FIGS. 15D and 15E, a wiring and the like is connected to a terminal 7330. When the electric potential of this wiring and the like is changed suddenly, the n-type TFT 7300 or the p-type TFT 7310 and the n-type TFT 7320 are turned ON so that electric current is flown toward a terminal 7340 from the terminal 7330. Accordingly, sudden variation in the electric potential connected to the terminal 7330 is alleviated so that damage or destruction of an element can be prevented. The element constituting the above protective circuit is preferably formed of an amorphous semiconductor, which is superior in pressure tightness. This embodiment can be implemented by being freely combined with the above embodiment modes.

Embodiment 6

Examples for electronic appliances manufactured to according to the present invention, typically include a digital camera; an audio reproduction device such as a car audio; a personal laptop computer; a game machine; a portable information terminal (such as a cellular phone, and a portable game machine); an image reproduction device having a recording medium such as a domestic game machine; and the like. Practical examples thereof are shown in FIGS. 10A to 10C and FIGS. 11A to 11C.

Figure 10A:
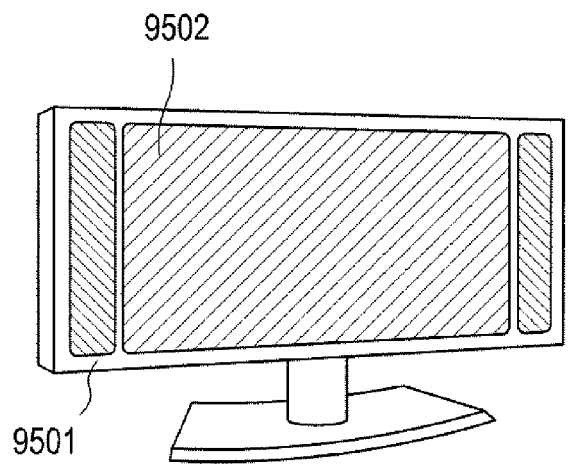
FIG. 10A to 10C are diagrams showing electronic appliances applied with the present invention (Embodiment 6)
Figure 10B:
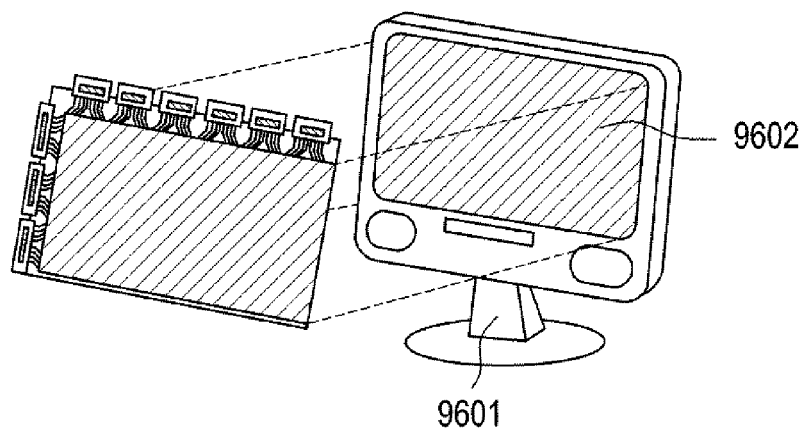
Figure 10C:
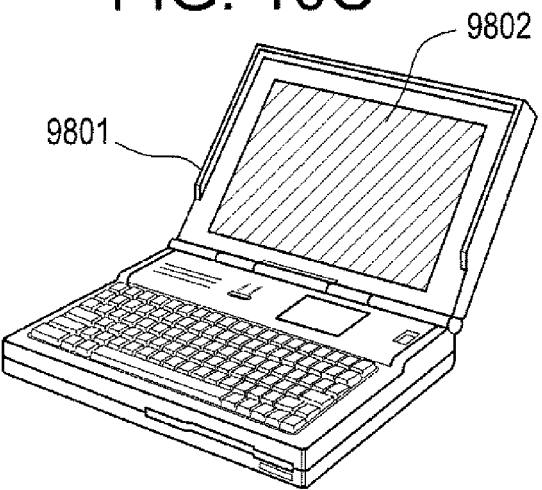

FIG. 10A is a TV set, which comprises a housing 9501, a display portion 9502, and the like. FIG. 10B is a monitor for a personal computer, which comprises a housing 9601, a display portion 9602, and the like. FIG. 10C is a personal laptop computer, which comprises a housing 9801, a display portion 9802, and the like. The present invention is applicable to display portions for each electronic appliance. As compared with the portable information terminals, the display portions for the above-mentioned electronic appliances are larger in size, and therefore, a large-size glass substrate of the so-called fourth generation and fifth generation or later is used. In the present invention, a wiring is formed by the droplet discharging technique, which is superior in material efficiency and is capable of reducing the number of manufacturing steps as compared with the case of using the conventional photolithography technique. Accordingly, price-reduction can be realized according to the present invention. From the viewpoint of the manufacturing steps and manufacturing costs, it is preferable that the display portions be formed of a transistor using an amorphous semiconductor and a microcrystalline semiconductor as a channel portion.

Figure 11A:
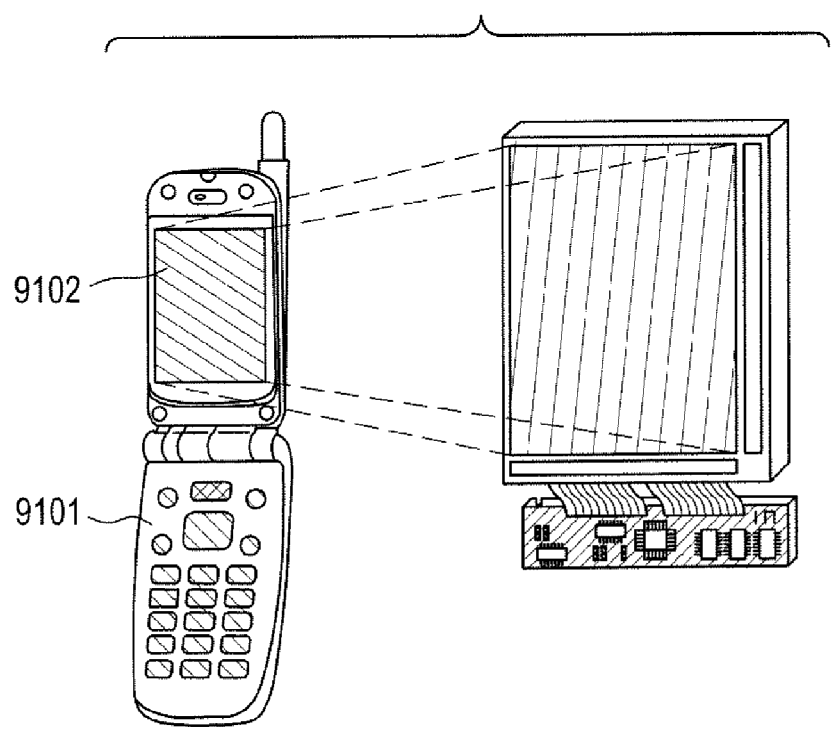
FIGS. 11A to 11C are diagrams showing electronic appliances applied with the present invention (Embodiment 6)
Figure 11B:
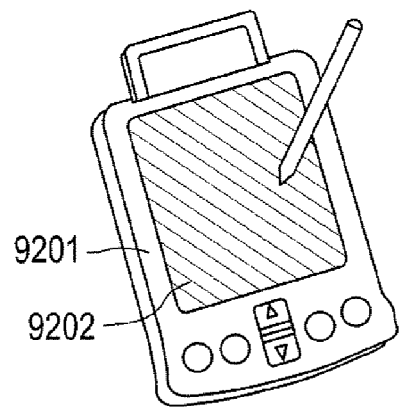
Figure 11C:
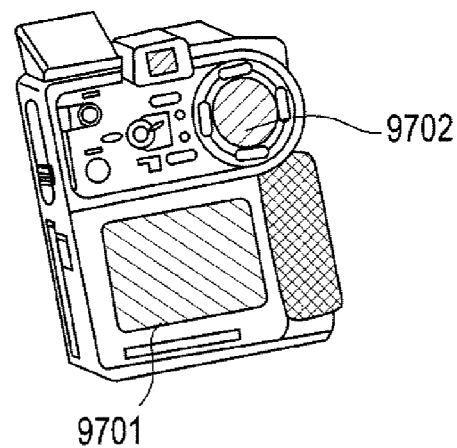

FIG. 11A is a cellular phone among the portable information terminals, which comprises a housing 9101, a display portion 9102, and the like. FIG. 11B is a personal digital assistance (PDA) among the portable information terminals, which comprises a housing 9201, a display portion 9202, and the like. FIG. 11C is a video camera, which comprises display portions 9701 and 9702, and the like. The present invention is applicable to the display portions for above-mentioned electronic appliances. Since the above-mentioned electronic appliances are portable terminals, each screen thereof is relatively small in size. Accordingly, display portions for the portable information terminals are preferably miniaturized by mounting a driver circuit using a thin film transistor, which employs a polycrystalline semiconductor as a channel, a function circuit such as a CPU, and a multilayer wiring over a same substrate as a display portion. At this moment, when a wiring is formed by droplet discharging, which is capable of reducing the number of processing steps, according to the invention, price-reduction can be realized. Furthermore, since each electronic appliance mentioned above is a portable information terminal, a display portion using a light emitting element is preferably employed so as to increase added value in terms of thinness, lightness, and miniaturization. The present embodiment can be implemented by being freely combined with the above-mentioned embodiment modes and embodiments.

The present invention has been fully described by way of embodiment modes and embodiments with reference to the accompanying drawings. As is well known to those skilled in the art, the present invention can be embodied in several forms, and the embodiment modes and its details can be changed and modified without departing from the purpose and scope of the present invention. Accordingly, interpretation of the present invention should not be limited to descriptions mentioned in the foregoing embodiment modes and embodiments. Note that in the structures according to the present invention described above, portions identical to each other are denoted by same reference numerals in the accompanying drawings.

What is claimed is:

1. A wiring substrate comprising:
   a first conductive layer including a high melting point metal formed so as to be in contact with an insulating layer comprising a material selected from the group consisting of an oxide material containing silicon or a nitride material containing silicon; and
   a second conductive layer comprising a material selected from the group consisting of silver, gold, copper, and indium tin oxide while being in contact with the first conductive layer,
   wherein the first conductive layer improves peel resistance of the second conductive layer.

2. A wiring substrate according to claim 1, wherein the first conductive layer has a film thickness of from 0.01 to 10 nm.

3. A wiring substrate according to claim 1, wherein the high melting point metal comprises a material selected from the group consisting of Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium).

4. A wiring substrate according to claim 1, wherein a thin film transistor is formed by using the insulating layer as a gate insulating film and using the second conductive layer as a gate electrode.

5. A wiring substrate comprising:
   a first conductive layer including a high melting point metal formed so as to be in contact with an insulating layer comprising a material selected from the group consisting of an organic material and a material with a skeleton structure formed by bonding silicon and oxygen; and
   a second conductive layer comprising a material selected from the group consisting of silver, gold, copper, or indium tin oxide while being in contact with the first conductive layer,
   wherein the first conductive layer improves peel resistance of the second conductive layer.

6. A wiring substrate according to claim 5, wherein the first conductive layer has a film thickness of from 0.01 to 10 nm.

7. A wiring substrate according to claim 5, wherein the high melting point metal comprises a material selected from the group consisting of Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium).

8. A wiring substrate according to claim 5, wherein a thin film transistor is formed by using the insulating layer as a gate insulating film and using the second conductive layer as a gate electrode.

9. A wiring substrate comprising:
   a substrate;
   an insulating layer provided over the substrate and comprising a material selected from the group consisting of an oxide material containing silicon or a nitride material containing silicon;
   a first conductive layer including a high melting point metal provided on the insulating layer; and
   a second conductive layer provided on the first conductive layer and comprising a conductive particle comprising a material selected from the group consisting of silver, gold, copper, and indium tin oxide,
   wherein a diameter of the conductive particle is 0.1 μm or less.

10. A wiring substrate according to claim 9, wherein the first conductive layer has a film thickness of from 0.01 to 10 nm.

11. A wiring substrate according to claim 9, wherein the high melting point metal comprises a material selected from the group consisting of Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium).

12. A wiring substrate according to claim 9, wherein a thin film transistor is formed by using the insulating layer as a gate insulating film and using the second conductive layer as a gate electrode.

13. A wiring substrate comprising:
   a substrate;
   an insulating layer provided over the substrate and comprising a material selected from the group consisting of an organic material and a material with a skeleton structure formed by bonding silicon and oxygen;
   a first conductive layer including a high melting point metal provided on the insulating layer; and
   a second conductive layer provided on the first conductive layer and comprising a conductive particle comprising a material selected from the group consisting of silver, gold, copper, and indium tin oxide,
   wherein a diameter of the conductive particle is 0.1 μm or less.

14. A wiring substrate according to claim 13, wherein the first conductive layer has a film thickness of from 0.01 to 10 nm.

15. A wiring substrate according to claim 13, wherein the high melting point metal comprises a material selected from the group consisting of Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium).

16. A wiring substrate according to claim 13, wherein a thin film transistor is formed by using the insulating layer as a gate insulating film and using the second conductive layer as a gate electrode.

17. A wiring substrate comprising:
   a first conductive layer including a high melting point metal formed so as to be in contact with an insulating layer; and
   a second conductive layer comprising a material selected from the group consisting of silver, gold, copper, and indium tin oxide while being in contact with the first conductive layer,
   wherein the first conductive layer improves adhesiveness between the insulating layer and the second conductive layer.

18. A wiring substrate according to claim 17, wherein the first conductive layer has a film thickness of from 0.01 to 10 nm.

19. A wiring substrate according to claim 17, wherein the high melting point metal comprises a material selected from the group consisting of Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium).

20. A wiring substrate according to claim 17, wherein a thin film transistor is formed by using the insulating layer as a gate insulating film and using the second conductive layer as a gate electrode.

21. A wiring substrate comprising:
   a first conductive layer including a high melting point metal formed so as to be in contact with an insulating layer comprising a material selected from the group consisting of an organic material and a material with a skeleton structure formed by bonding silicon and oxygen; and
   a second conductive layer comprising a material selected from the group consisting of silver, gold, copper, or indium tin oxide while being in contact with the first conductive layer,
   wherein the first conductive layer improves adhesiveness between the insulating layer and the second conductive layer.

22. A wiring substrate according to claim 21, wherein the first conductive layer has a film thickness of from 0.01 to 10 nm.

23. A wiring substrate according to claim 21, wherein the high melting point metal comprises a material selected from the group consisting of Ti (titanium); W (tungsten); Cr (chromium); Al (aluminum); Ta (tantalum); Ni (nickel); Zr (zirconium); Hf (hafnium); V (vanadium); Ir (iridium); Nb (niobium); Pd (lead); Pt (platinum); Mo (molybdenum); Co (cobalt); and Rh (rhodium).

24. A wiring substrate according to claim 21, wherein a thin film transistor is formed by using the insulating layer as a gate insulating film and using the second conductive layer as a gate electrode.

* * * * *